United States Patent [19]

Kokei et al.

[11] 4,262,255
[45] Apr. 14, 1981

[54] LEVEL INDICATING DEVICE

[75] Inventors: Akira Kokei, Moriguchi; Mineo Ohshima, Yahata; Koichi Sakai, Otsu, all of Japan

[73] Assignee: Matsushita Electric Industrial Co., Ltd., Osaka, Japan

[21] Appl. No.: 886,575

[22] Filed: Mar. 14, 1978

[30] Foreign Application Priority Data

| Mar. 18, 1977 | [JP] | Japan | 52-30925 |
| Mar. 18, 1977 | [JP] | Japan | 52-30927 |
| Mar. 18, 1977 | [JP] | Japan | 52-30928 |
| Mar. 18, 1977 | [JP] | Japan | 52-34233[U] |
| Mar. 31, 1977 | [JP] | Japan | 52-37260 |
| Mar. 31, 1977 | [JP] | Japan | 52-37262 |

[51] Int. Cl.³ .................. G01R 19/04; G01R 19/00
[52] U.S. Cl. .................. 324/103 P; 324/96; 324/122; 340/754
[58] Field of Search .......... 324/103 P, 103 R, 122, 324/96; 307/351; 313/500, 510, 513, 517; 340/753, 754, 722

[56] References Cited

U.S. PATENT DOCUMENTS

| 3,922,666 | 11/1975 | Inami et al. | 324/122 |
| 4,004,220 | 1/1977 | Kerber et al. | 324/103 P |
| 4,127,794 | 11/1978 | Frankland | 340/753 |

OTHER PUBLICATIONS

Santoni, A.; "At a Glance . . . "; Electronics; vol. 49, No. 15, pp. 114-118, Jul. 22, 1976.
Edwards, D.; "LED Level Meters"; Electronics, Australia; Jun. 1976; pp. 48, 49, 125, 51.

Primary Examiner—Ernest F. Karlsen
Attorney, Agent, or Firm—Wenderoth, Lind & Ponack

[57] ABSTRACT

A level indicating device for indicating input signal level purely electrically which includes a plurality of voltage comparators having threshold values set in order in terms of level, and a fluorescent indicator tube incorporating therein a plurality of anode electrodes aligned in a row. The outputs of the voltage comparators are connected to respective anode electrodes, so that when a signal is applied to the voltage comparators, the level of the signal is indicated by the number of the anode electrodes illuminated.

2 Claims, 38 Drawing Figures

LEVEL INDICATING DEVICE

BACKGROUND OF THE INVENTION

The present invention relates to an indicating arrangement and more particularly, to a level indicating device not employing a mechanical indicating meter for use in electrical and electronic equipment, for example, acoustic equipment such as magnetic recording and reproducing apparatuses, stereophonic reproducing apparatuses, radio receiving apparatuses, etc.

Conventionally, most level indicating devices employ indicators or meters which function mechanically for indicating levels by the deflection of the pointer needles of these meters.

The known level indicating devices with the pointer needle meters as described above have serious disadvantages in that there is a delay of approximately several hundred m sec. in rise time before the pointer needle of the meter starts deflecting when a signal whose level is to be indicated is supplied to the indicating device, and that the pointer needle tends to overshoot or undesirably deflect beyond the position corresponding to the level of this signal. Thus it is difficult to correctly indicate the level of a particular signal. The disadvantages as described above are inherent in the known indicating meters of the needle pointer type and are difficult to perfectly eliminate however accurately these meters are produced. Production of very high precision meters of this type not only results in an extreme increase in cost, but these meters are delicate construction and tend to be comparatively easily broken even by slight external vibrations or shocks, thus not being suitable for actual use.

Furthermore, in the conventional level indicating devices of the pointer needle type as described above, since it is quite impossible, owing to their construction, to alter the configuration at the indicating portion thereof, for example, to form this indicating portion into a wave-like or corrugated configuration, the design of acoustic appliances and the like is largely restricted by employment of meters of the above described type. Thus it is very difficult to adopt a fundamentally unique design which may not be found elsewhere.

Additionally, level indicating by pointer needle deflection is effective as an indicating means only when a user follows the tip of the pointer needle with his eyes and it is rather difficult to read off accurate measured values from moment to moment. Particularly, it has been almost impossible to grasp variations of levels in numerical values, for example, in dB, etc.

SUMMARY OF THE INVENTION

Accordingly, an essential object of the present invention is to provide a level indicating device for use in electrical and electronic equipment which is arranged to effect the level indication purely electrically without employment of a mechanical meter having a pointer needle or the like.

Another important object of the present invention is to provide a level indicating device of the above described type which is capable of indicating a signal level in a readily readable manner with substantial elimination of the disadvantages inherent in the conventional level indicating devices.

A further object of the present invention is to provide a level indicating device of the above described type which is provided with an indicating portion readily changeable into various configurations suit to designs of electrical and electronic equipment to which it is applied.

A still further object of the present invention is to provide a level indicating device of the above described type which is stable and accurate in function with sufficient resistance against external vibrations and shocks.

Another object of the present invention is to provide a level indicating device of the above described type which is sample in construction and can be incorporated into various electrical and electronic equipment at low cost.

In accomplishing these and other objects, according to one preferred embodiment of the present invention, the level indicating device for use in electrical and electronic apparatuses is arranged to function purely electrically, and includes an output producing means or voltage comparator unit having a plurality of voltage comparators, the threshold values of which are set in predetermined order in terms of level, and a fluorescent indicating means or fluorescent indicator tube incorporating a plurality of fluorescent elements or anode electrodes aligned in a row. The outputs of the voltage comparators are respectively coupled to the anode electrodes. Thus when an input signal is applied to the voltage comparators, the level of this input is indicated by the number of the anode electrodes of the fluorescent indicator tube illuminated. By the above arrangement, an improved level indicating device accurate in function and easy to read is advantageously presented through simple construction and consequent low cost, without employment of mechanical meters or the like having pointer needles, with substantial elimination of the disadvantages inherent in the conventional level indicating devices.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, note that like parts are designated by like reference numerals and symbols throughout the several views of the accompanying drawings.

DETAILED DESCRIPTION OF THE INVENTION

Figure 1:
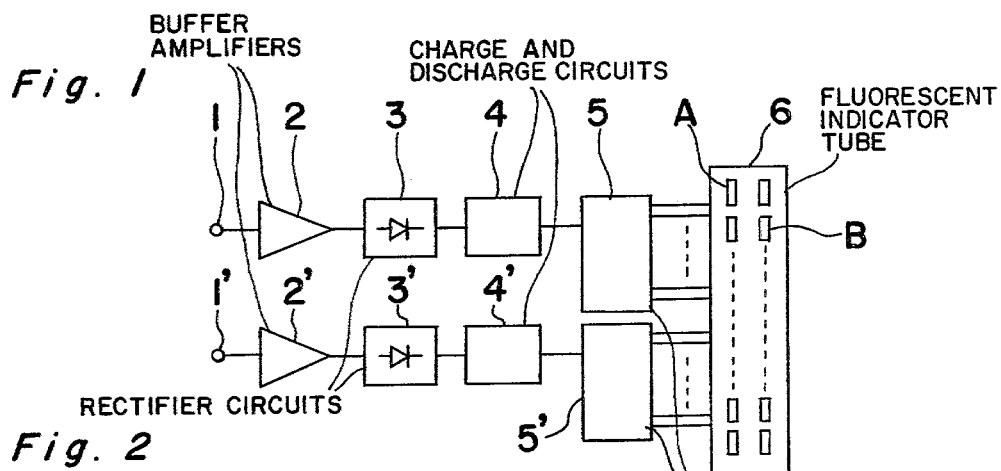
FIG. 1 is a block diagram showing the construction of a level indicating device according to one preferred embodiment of the present invention.

Referring now to the drawings, there is shown in FIG. 1 a fundamental block diagram of a level indicating device according to one preferred embodiment of the present invention. The level indicating device of FIG. 1, which employs a fluorescent indicator tube 6 as the indicating means, is intended to effectively indicate the signal levels of a plurality of channels in an indicating portion of small space having good external appearance, and includes signal input terminals 1 and 1' coupled to buffer amplifiers 2 and 2', rectifier circuits 3 and 3' respectively connected to outputs of the buffer amplifiers 2 and 2' and also to the input terminals of charge and discharge circuits 4 and 4', voltage comparators units 5 and 5' connected to respective output terminals of the charge and discharge circuits 4 and 4', and the fluorescent indicator tube 6 having two sets of luminescent elements electrodes A and B coupled to respective output terminals of the voltage comparator units 5 and 5'.

By the above arrangement, signals applied to the input terminals 1 and 1' are respectively applied to the buffer amplifiers 2 and 2' for amplification and impedance conversion. The outputs from the amplifiers 2 and 2' are further converted into DC voltages by the rectifier circuits 3 and 3'. Each of the DC voltages from the rectifier circuits 3 and 3' is applied to a respective charge and discharge circuit 4 and 4' composed of resistors and capacitors. The indication response characteristics of the indicator are determined by properly setting the time constants of these resistors and capacitors. The outputs of the charge and discharge capacitors 4 and 4' are respectively applied to the voltage comparator units 5 and 5'. The two sets of the luminescent electrodes A and B, each set being composed of a plurality of luminescent elements which are provided in the indicator or fluorescent indicator tube 6, are illuminated according to the signal levels by the outputs from the voltage comparator units 5 and 5'.

Figure 2:
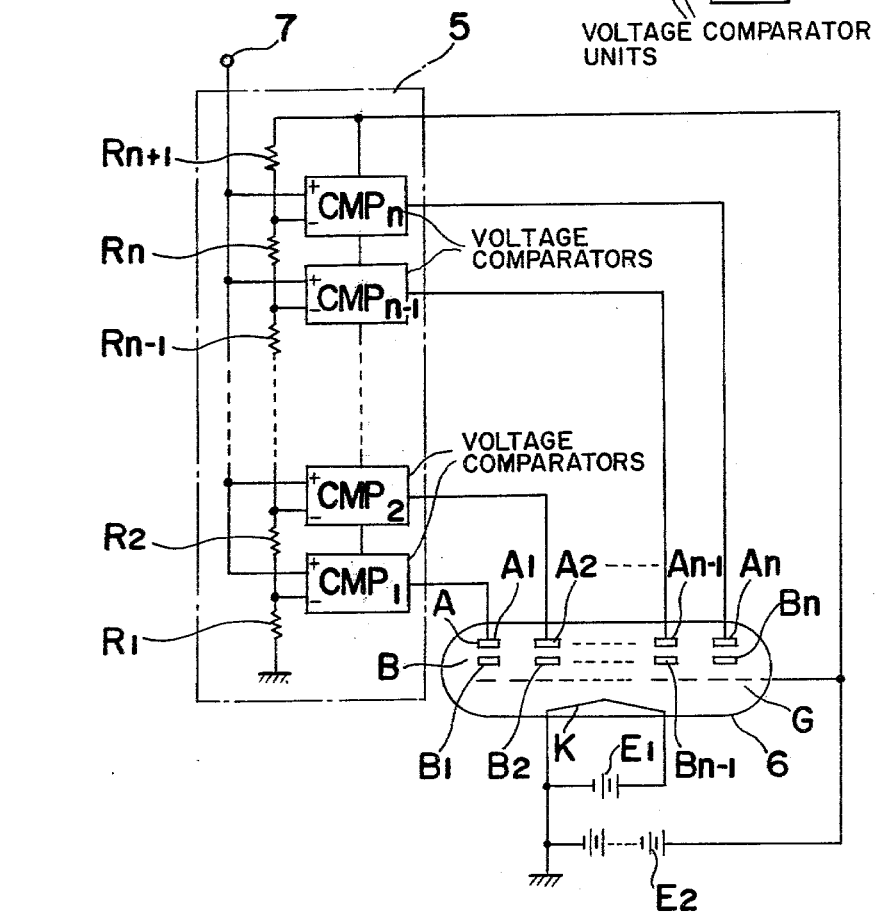
FIG. 2 is an electrical circuit diagram showing the connections between the voltage comparators and the fluorescent indicator tube employed in the level indicating device of FIG. 1.

Referring also to FIG. 2 showing an electrical circuit diagram which illustrates the connections, for example, between the voltage comparator unit 5 and the indicator or fluorescent indicator tube 6, the output, for example, from the charge and discharge circuit 4 is applied to a terminal 7 of the voltage comparator unit 5 and the input signal is further applied to a plurality of voltage comparators CMP1, CMP2 ... CMP(n−1) and CMP$_n$ in the voltage comparator unit 5. Since voltages at potential points obtained by dividing the voltage of the DC power source E2 by resistors R1, R2 ... R(n−1), Rn and R(n+1) are impressed upon the respective voltage comparators CMP1, CMP2 ... CMP(n−1) and CMPn, the voltage comparators CMP1, CMP2 ... CMP(n−1) and CMPn are arranged having their threshold values in the order of CMP1, CMP2 ... CMP(n−1) and CMPn. On the other hand, the voltage of the DC power source E2 is applied to each of the voltage comparators CMP1, CMP2 ... CMP(N−1)

and CMPn, and when the threshold values set for the respective voltage comparators CMP1, CMP2 . . . CMP(n−1) and CMPn are exceeded, the voltage of the power source E2 is obtained at the outputs of those voltage comparators. These voltages are applied to the one set A of the luminescent electrodes, i.e., anode electrodes A1, A2 . . . A(n−1) and An of the fluorescent indicator tube 6.

Figure 3:
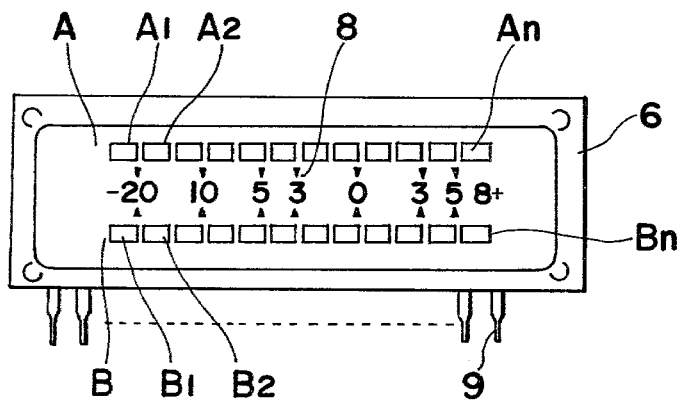
FIG. 3 is a front view of the fluorescent indicator tube employed in the circuit of FIG. 2.

Referring also to FIG. 3, the fluorescent indicator tube 6 has another set B of anode electrodes B1, B2 . . . B(n−1) and Bn besides the anode electrodes A1, A2 . . . A(n−1) and An. These sets A and B of anode electrodes are arranged in the fluorescent indicator tube 6 in such a manner that the anode electrodes A1, A2 . . . A(n−1) and An are laterally disposed from left to right in a row at the upper portion in FIG. 3, while the anode electrodes B1, B2 . . . B(n−1) are Bn are also laterally arranged from left to right in a row below the row of the anode electrodes A1, A2 . . . A(n−1) and An. A level indicating scale 8 has numerical graduations formed in the space between the two sets A and B of anode electrodes. A voltage from the DC power source E1 is applied to the cathode K (FIG. 2) of the fluorescent indicator tube 6. The grid G is connected to the DC voltage source E2, while the fluorescent indicator tube 6 is provided with terminals 9 for external connection thereto as shown in FIG. 3. Each of the anode electrodes A1, A2 . . . An(n−1) and An, and B1, B2 . . . B(n−1) and Bn of the fluorescent indicator tube 6 has a fluorescent substance applied to its surface for excitation and illumination of the fluorescent substance upon collision of electrons with this fluorescent substance in a known manner. Note that in FIG. 2, the circuit diagram shows connections between the voltage comparator unit 5 and fluorescent indicator tube 6 for only one channel for brevity, since the relation between the voltage comparator unit 5' and the other channel of the fluorescent indicator tube 6 is similar to that of the first channel.

In the above arrangement, when a signal is impressed, for example, onto the input terminal 1, the signal is converted into a DC current by the rectifier circuit 3 through the buffer amplifier 2, and is then applied to the terminal 7 of the voltage comparator unit 5 through the charge and discharge or time constant circuit 4. When the signal level impressed onto the terminal 7 exceeds the threshold value of the voltage comparator CMP1 and is lower than the threshold value of the voltage comparator CMP2, an output is developed only by the voltage comparator CMP1. Since the output voltage is applied to the anode electrode A1 of the indicator tube 6, a large potential difference is built up between the anode electrode A1 and the cathode K, with the result that the electrons emitted from the cathode K are accelerated to collide with the anode electrode A causing the fluorescent substance of the electrode A1 to be illuminated. Accordingly, only the anode electrode A1 is illuminated, thus the signal level impressed upon the input terminal 1 is indicated. On the other hand, if the voltage applied to the terminal 7 corresponding to the signal impressed onto the input terminal 1 exceeds the threshold value of the voltage comparator CMPn, outputs are obtained at the respective comparators CMP1, CMP2 . . . CMP(n−1) and CMPn and subsequently impressed upon the anode electrodes A1, A2 . . . A(n−1) and An. Thus all of the anode electrodes are illuminated.

In the manner as described above, the number of the anode electrodes A1, A2 . . . A(n−1) and An of the indicator tube 6 illuminated varies according to the level of the signal applied to the input terminal 1, and thus the level indication of the input signal is effected by the number of illuminated anode electrodes.

On the other hand, the anode electrodes B1, B2 . . . B(n−1) and Bn of the indicator tube 6 are illuminated in a similar manner by the input signal impressed upon the input terminal 1', and the signal level is indicated by the number of the anode electrodes illuminated.

Accordingly, in the foregoing embodiment of the present invention, the level indications for two channels may be effected by a single fluorescent indicator tube 6 and the level can be read according to the indication scale 8. The indicating device is readily applicable to a signal level indicating device, for example, of acoustic appliances such as magnetic recording and reproduction apparatuses.

Figure 4:
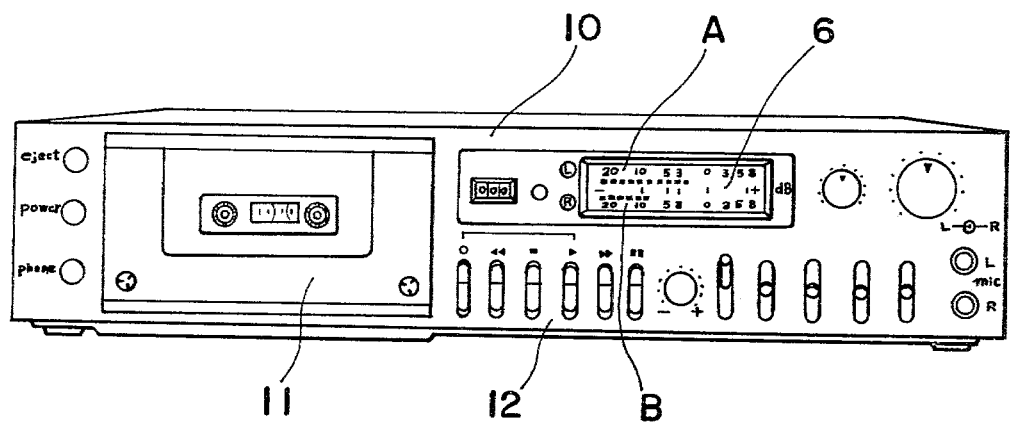
FIG. 4 is a perspective front view of a magnetic recording and reproducing apparatus in which the arrangement of FIG. 1 is incorporated.

In FIG. 4, there is shown a magnetic recording and reproducing apparatus 10 in which the level indicating device according to the foregoing embodiment is incorporated. The apparatus 10 having a rectangular box-like configuration has a tape cassette housing 11, a control section 12 having a plurality of switches, and a level indicating device using a fluorescent indicator tube 6 according to the present invention mounted on its front surface. In the above arrangement, the stereophonic signal and the reproduced signal to be recorded into the magnetic tape can be effectively indicated by the sets of the luminescent electrodes A and B.

Note here that the fluorescent indicator tube 6 described as employed in the foregoing embodiment may be replaced by other indicators, for example, an indicator including a plurality of light emitting diodes preliminarily mounted on a suitable substrate at a predetermined interval or an indicator having a plurality of other kinds of indicating elements mounted on a base depending on necessity.

Note also that although the foregoing embodiment is mainly described with reference to a level indicating device with a two channel signal indication, the concept of the present invention is not limited in its application to such an indication for a two channel signal, but may be readily applicable to level indication of signals on more than two channels.

As is clear from the foregoing description, in the first embodiment of FIGS. 1 to 4 according to the present invention, since signal levels of a plurality of channels are arranged to be indicated by the number of illuminated luminescent electrodes independently for each of the channels in the plurality of rows of the luminescent elements or electrodes, it is possible to effectively and relatively indicate the signal levels of a plurality of channels by means of the plurality of rows of luminescent elements. Moreover, since the indicator tube of this invention has the plurality of luminescent elements incorporated therein as described above, this plurality of luminescent elements are arranged in good order merely by installing the single indicator tube for a wide variety of applications.

It is needless to say that if the level indicating device of the foregoing embodiment is to be used for indication of signal for only one channel, provision of the luminescent elements in only one row is sufficient for that purpose.

Figure 5:
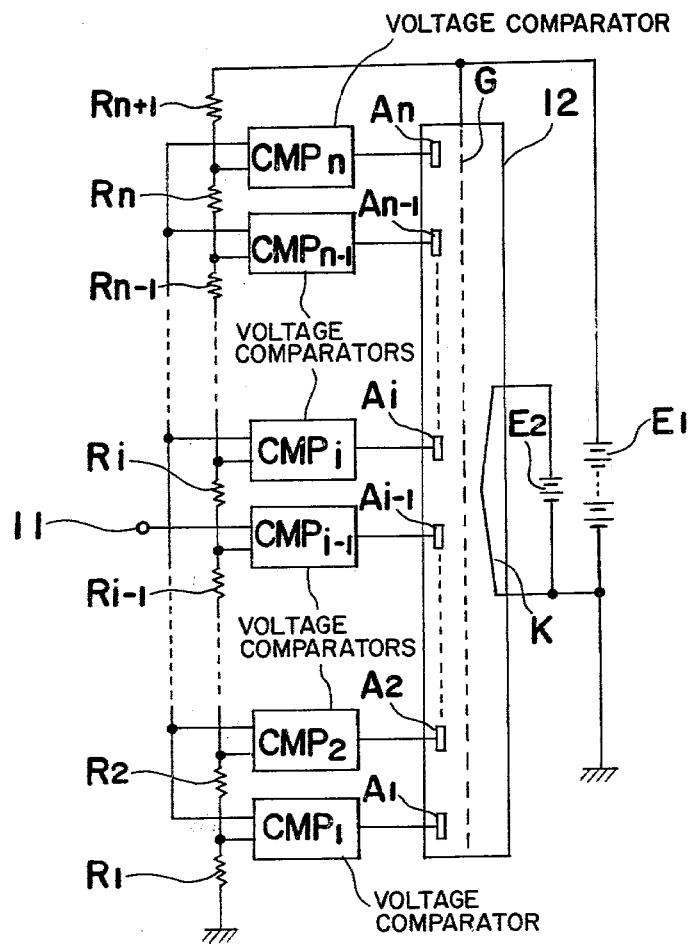
FIG. 5 is a diagram similar to FIG. 2, which particularly shows a second embodiment thereof.

Referring to FIG. 5, there is shown a second embodiment of the level indicating device according to the present invention which is arranged to carry out effective level indication by altering the configurations and sizes of a plurality of luminescent portions which have predetermined reference levels corresponding to the input signal and which are illuminated when signals having levels lower than these reference levels are applied thereto, and of a plurality of luminescent portions which also have predetermined reference levels corresponding to the input signals and which are illuminated when signals having levels higher than these reference levels are applied thereto.

In the circuit of FIG. 5, the threshold value setting terminals of the voltage comparators CMP1, CMP2 ... CMP(n−1) and CMPn are connected to respective potential points obtained by dividing the voltage of the DC power source E1 by the resistors R1, R2 ... R(n−1), Rn and R(n+1). The signal input terminals of the voltage comparators are respectively connected to a terminal 11. An AC signal or a DC signal obtained by rectifying and smoothing the AC signal is applied to the terminal 11. When the signal level thereof exceeds the threshold value of each of the voltage comparators, an output is produced from the voltage comparators CMP1, CMP2 ... CMP(n−1) and CMPn. Since the voltage of the DC power source E1 is applied to the voltage comparators CMP1, CMP2 ... CMP(n−1) and CMPn, a voltage corresponding to that of the DC power source E1 is obtained at the output of each of these voltage comparators. Needless to say if the signal levels impressed upon these voltage comparators are lower than the threshold values of the respective voltage comparators, the output signals from the voltage comparators are of ground potential. The outputs of the voltage comparators CMP1, CMP2 ... CMP(n−1) and CMPn are connected to respective anode electrodes A1, A2 ... A(n−1) and An of the fluorescent indicator tube 12. The grid G of the indicator tube 12 is connected to the DC power source E1 and the cathode K thereof to the DC voltage source E2.

Figure 6:
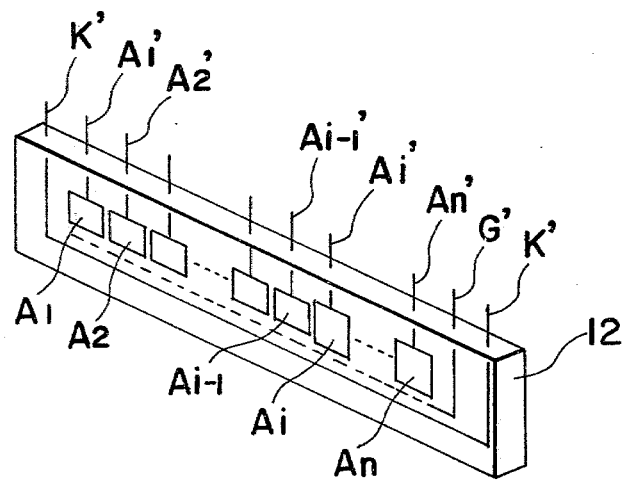
FIG. 6 is a schematic perspective view of a fluorescent indicator tube employed in the circuit of FIG. 5.

As is seen from FIG. 6, the anode electrodes A1, A2 ... A(n−1) and An of the fluorescent indicator tube 12 are each formed into a rectangular configuration, and arranged laterally in one row in the order A1, A2 ... A(n−1) and An from left to right, while another set of electrodes A1 ... and A(i−1) coupled to the output of the respective voltage comparators CMPi ... and CMP(i−1) is interposed in the row of the anode electrodes A1, A2 ... A(n−1) and An in alignment with the latter as shown. Note that the electrodes Ai ... and An at the right hand side respectively are formed larger in size than the electrodes A1 ... and A(i−1). The electrodes A1, A2 ... A(n−1) and An, electrodes Ai ... and A(i−1), grid G and cathode K are provided with respective terminal lead wires A'1, A'2 ... A'(n−1) and A'n, A'i ... and A'(i−1), G' and K' leading out from the indicator tube 12.

By the above arrangement, when the signal level applied to the terminal 11 exceeds the threshold value of the voltage comparator CMP1 and is lower than the threshold value of the voltage comparator CMP2, only the output from the voltage comparator CMP1 becomes the potential of the DC voltage source E1 thereby producing a potential difference across the anode electrode A1 and cathode K. Thus the electrons emitted from the cathode K are accelerated by the grid G to collide with the anode electrode A1 for exciting and illuminating the fluorescent substance applied onto the electrode A1. Meanwhile, if the input signal level exceeds the threshold value of the voltage comparator CMP2, the anode electrodes A1 and A2 of the indicator tube 12 are illuminated. In a similar manner, when the signal level exceeds the threshold value of the voltage comparator CMPn, all of the anode electrodes A1, A2 ... A(n−1) and An are illuminated, whereby the magnitude of the signal level is indicated by the number of the anode electrodes thus illuminated.

Note here that by forming the sizes of the anode electrodes A1 ... and An larger than those of the electrodes A1 ... and A(i−1) as described above, the illumination of the electrodes Ai ... and An attracts more attention than that of the electrodes A1 ... and A(i−1) for a strong visual impression.

Accordingly, with the employment of the level indicating device according to the second embodiment of the present invention, for example, as an indicating device of recording signal level for a magnetic recording and reproducing apparatus, if the arrangement is so made that the anode electrodes A1, A2 ... and A(i−1) are sequentially illuminated at the levels lower than predetermined recording reference levels (0 dB) and the anode electrodes Ai ... and An are sequentially illuminated at the levels higher than the above, it is possible to clearly indicate that the recording level is over the reference level by the fact that the illuminating areas of the anode electrodes Ai ... and An are large. Thus a level indication quite effective for an operator of the magnetic recording and reproducing apparatus is advantageously achieved.

Note here that in the second embodiment of the invention as described above, although the sizes of the anode electrodes are described as altered, a similar effect can also be achieved by altering the configurations of the anode electrodes A1 ... and A(i−1) and the electrodes Ai ... and An.

Figure 7:
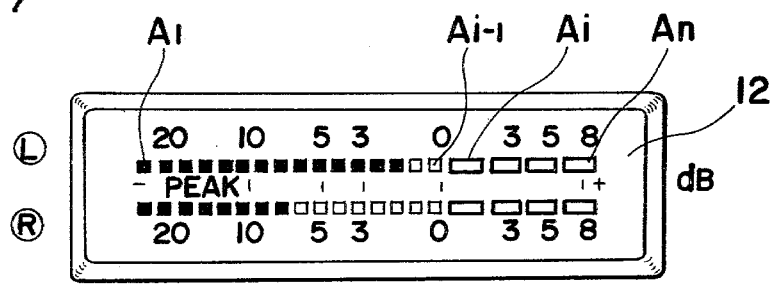
FIG. 7 is a front view showing another example of the fluorescent indicator tube of FIG. 6.

Referring to FIG. 7, there is shown a stereophonic magnetic recording and reproduction apparatus to which the level indicating device according to the second embodiment of the present invention is applied for level indication of the left and right channel signals. In this apparatus, it is so arranged that the anode electrodes A1 ... and A(i−1) of rectangular shape show rectangular pattern when illuminated as shown in black in the drawing, while the anode electrodes Ai ... and An of framed shape for levels higher than 0 dB define the corresponding framed patterns when illuminated.

As is seen from the foregoing description, in the level indicating device according to the second embodiment of the invention, since the magnitude of the signal level can be clearly indicated by the number of illuminated anode electrodes of the fluorescent indicator tube, it is possible to indicate the levels in a quite effective manner permitting simultaneous indication as to whether the particular signal level is lower than or higher than the reference level by altering the sizes or configurations of the set of the anode electrodes which are to be illuminated at the signal levels lower than the reference level, from those of the other set of the anode electrodes which are to be illuminated at the signal levels higher than the reference level. This arrangement is particularly suitable, for example, for an indicating device of the recording signal level for a magnetic recording and reproducing apparatus permitting simultaneous indication of "over-level".

Figure 8:
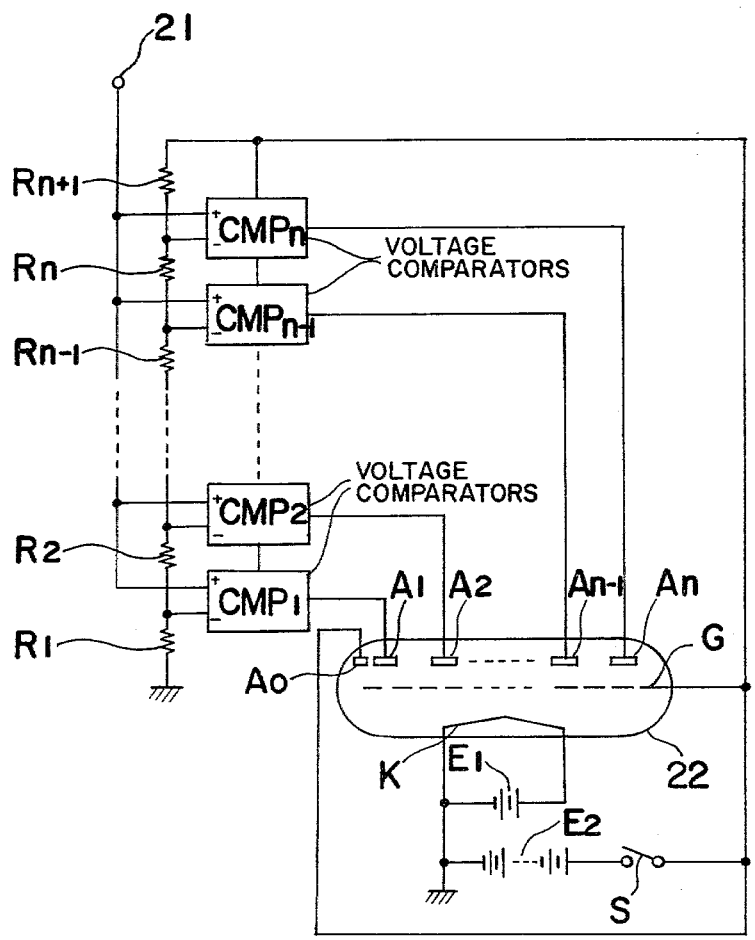
FIG. 8 is a diagram similar to FIG. 2, which particularly shows a third embodiment thereof.

Referring to FIG. 8, there is shown a level indicating device according to a third embodiment of the present invention in which the starting point of the indication is made particularly clear for effective indication of the magnitude of the signal level employing a fluorescent indicator tube as the indicator.

In the circuit of FIG. 8, the threshold value setting terminals of the voltage comparators CMP1, CMP2 ... CMP(n−1) and CMPn are respectively connected to potential points obtained by dividing the voltage of the DC power source E2 connected through a switch S by the resistors R1, R2 ... R(n−1), Rn and R(n+1), while the signal input terminals are respectively connected to the terminal 21. An AC signal or a DC signal obtained by rectifying and smoothing the AC signal is applied to the terminal 21. When the signal level on terminal 21 exceeds the threshold value of each of the voltage comparators, an output is produced from the voltage comparators CMP1, CMP2 ... CMP(n−1) and CMPn. Since the voltage of the DC power source E2 is applied through the switch S to the voltage comparators CMP1, CMP2 ... CMP(n−1) and CMPn, a voltage corresponding to that of the DC power source E2 is obtained at the output of each of these voltage comparators. Needless to say if the signal levels impressed upon these voltage comparators are lower than the threshold values for the respective voltage comparators, the output signals from the voltage comparators are of ground potential. The outputs of the voltage comparators CMP1, CMP2 ... CMP(n−1) and CMPn are connected to the respective anode electrodes A1, A2 ... A(n−1) and An of the fluorescent indicator tube 22. The grid G of the indicator tube 22 is connected through the switch S to the DC power source E2 and the cathode K of indicator tube 22 is connected to a DC voltage source E1.

Figure 9:
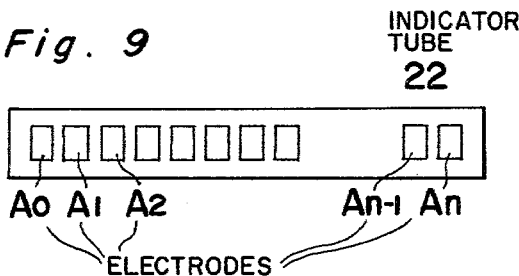
FIG. 9 is a schematic front view of the indicating portion of the fluorescent indicator tube employed in the circuit of FIG. 8.

As is seen from FIG. 9, the anode electrodes A1, A2 ... A(n−1) and An of the fluorescent indicator tube 22 are each formed into a rectangular configuration, and arranged laterally in one row in the order A1, A2 ... A(n−1) and An from left to right. Another anode electrode $A_0$ is provided at the left hand side of the anode electrode A1, with the anode electrode $A_0$ being connected to the DC power source E2 through the switch S.

By the above arrangement, with the switch S closed, when the signal level applied to the terminal 21 exceeds the threshold value of the voltage comparator CMP1 and is lower than the threshold value of the voltage comparator CMP2, only the output from the voltage comparator CMP1 is converted to the potential of the DC voltage source E2 thereby producing a potential difference across the anode electrode A1 and cathode K. Thus the electrons emitted from the cathode K are accelerated by the grid G to collide with the anode electrode A1 for exciting and illuminating the flourescent substance applied onto the electrode A1. Meanwhile, if the input signal level exceeds the threshold value of the voltage comparator CMP2, the anode electrodes A1 and A2 of the indicator tube 22 are illuminated. In a similar manner, when the signal level exceeds the threshold value of the voltage comparator CMPn, all of the anode electrodes A1, A2 ... A(n−1) and An are illuminated, whereby the magnitude of the signal level is indicated by the number of the anode electrodes thus illuminated.

Note here that in the above state, when the switch S is closed, i.e., when the operation for indication to illuminate the anode electrodes A1 and A2 of the fluorescent indicator tube 22 is effected, the voltage from the DC power source E2 is applied to the anode electrode $A_0$ irrespective of the output from the voltage comparators to excite the fluorescent substance of the anode electrode $A_0$ for illuminating electrode $A_0$. The illumination of the anode electrode $A_0$ sets a starting point of illumination for the electrodes A1, A2 ... A(n−1) and An, and eliminates the inconvenience that, when the signal level for initiating the illumination, for example, of the electrode A1 is extremely unstable, electrode A1 is not illuminated despite the presence of an input signal, and simultaneously indicates that the indicator tube 22 is ready for level indication.

The level indicating device according to the third embodiment as described in the foregoing may most suitably applicable, for example, to a signal level indicating device for acoustic appliances such as magnetic recording and reproducing apparatuses. More specifically, for the level indication of recording or reproducing signal of a magnetic recording and reproducing apparatus, if the switch S is arranged to be closed in association with turning ON of the power supply for the magnetic recording and reproducing apparatus, the power supply is indicated as ON by the illumination of the anode electrode $A_0$, and further, if the switch is arranged to be closed in association with the starting operation of the recording or reproducing, the state of such recording or reproducing is clearly indicated. In the above case, when the anode electrode $A_0$ is illuminated by any of the above procedures, the illumination sets the starting points for the illumination of the anode electrodes A1, A2 ... A(n−1) and An which are illuminated by the outputs from the voltage comparators CMP1, CMP2 ... CMP(n−1) and CMPn, with particular effects for indication as described hereinbelow.

More specifically, the minimum signal levels by which the voltage comparator CMP1 emits its output deviates to a certain extent due to deviations in the characteristics of the components constituting the voltage comparator or of the fluorescent indicator tube 22. Therefore, even if the minimum signal level for causing, for example, the voltage comparator CMP1 to emit its output is set, for example, at −30 dB, this output may be developed, for example, at −28 dB or at −25 dB, thus resulting in an inconvenience that the proper indication is not achieved notwithstanding proper signal input.

Figure 10:
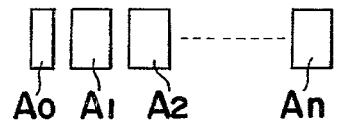
FIG. 10 is a front view showing another example of the indicating portion of FIG. 9.

In the level indicating device according to the third embodiment of the present invention as described above, the inconvenience as described above is advantageously eliminated by the provision of the anode electrode $A_0$, thus effectively achieving an indication quite natural to observe. Note that the configuration of the anode electrode $A_0$ may be modified to be different from the configuration of the electrodes A1, A2 ... A(n−1) and An as shown in FIG. 10. Note that in the foregoing third embodiment, although description is made mainly with reference to a level indication device equipped with a fluorescent indicator tube, this fluorescent indicator tube may of course be replaced by other luminescent elements, for example, light emitting diodes or the like.

As is clear from the foregoing description, according to the third embodiment of the present invention, the magnitude of the signal level can be definitely indicated by the variation of the number of illuminated indication elements for very effective level indication. Furthermore, by the provision of a particular indicating element which is illuminated independently of the signal level in the position next to the indication element which is illuminated by the minimum signal level of the set of the indicating elements which are illuminated on the basis of the corresponding signal levels, not only is the starting point of the signal level indication made clear by the particular indicating element, but the disadvantage in the conventional arrangement that the indicating element is not illuminated even in the presence of an input signal is advantageously eliminated, with simultaneous indication that the signal level is ready to be shown.

Figure 11:
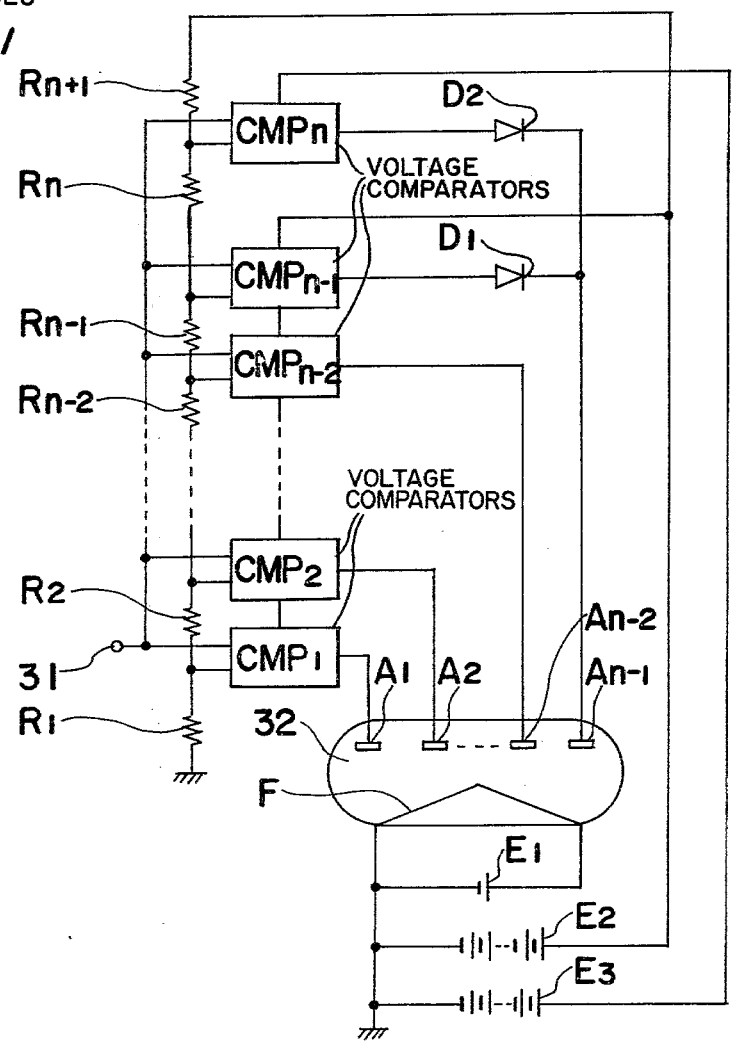
FIG. 11 is a circuit diagram similar to FIG. 2, which particularly shows a fourth embodiment thereof.
Figure 12:
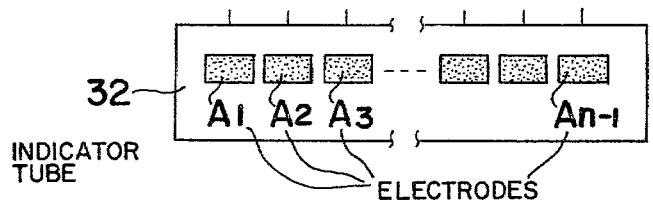
FIG. 12 is a schematic front view of the fluorescent indicator tube employed in the circuit of FIG. 11.

Referring now to FIGS. 11 and 12, the level indicating device according to a fourth embodiment of the present invention is arranged so that by applying to a plurality of indicating elements voltages from a plurality of respective voltage comparators having threshold values arranged in order, the indicating elements corresponding to the input signal levels are illuminated with an effective indication of the input signals even when input signals having levels higher than those preliminarily set are applied.

In the circuit of FIG. 11, the threshold value setting terminals of the voltage comparators CMP1, CMP2 ... CMP(n−1) and CMPn are respectively connected to potential points obtained by dividing the voltage of the DC power source E2 by the resistors R1, R2 ... R(n−1), Rn and R(n+1), while the signal input terminals are respectively connected to the terminal 31. An AC signal or DC signal obtained by rectifying and smoothing the AC signal is applied to the terminal 31. When the signal level thereof exceeds the threshold value of each of the voltage comparators, the outputs produced by the voltage comparators CMP1, CMP2 .. . CMP(n−1) and CMPn are the level of the voltage of said DC power source E2. On the other hand, if the signal level impressed upon these voltage comparators is lower than the threshold values of the respective voltage comparators, the outputs from these voltage comparators are of ground potential. The outputs of the voltage comparators CMP1, CMP2 ... CMP(n−2) are connected to respective anode electrodes A1, A2 ... and A(n−2) of the fluorescent indicator tube 32, while the output sides of the voltage comparators CMP(n−1) and CMPn are connected to the anode electrode A(n−1) through diodes D1 and D2.

Meanwhile, voltage from a DC power source E3 which is higher than the voltage of the DC power source E2 is applied to the voltage comparator CMPn. When an input signal having a level higher than the threshold value of the voltage comparator CMP(n−1) is fed and this signal level exceeds the threshold value of the voltage comparator CMPn, a voltage equivalent to the voltage of the power source E3 is applied to the anode electrode A(n−1). Thus the anode electrode A(n−1) is illuminated at a brightness higher than the brightness of illumination of the other anode electrodes A1 ... A(n−2). Note that the filament F which is the cathode of the fluorescent indicator tube 32 is connected to the DC power source E1, with one side at ground potential.

By the above arrangement, when the signal level applied to the terminal 31 exceeds the threshold value of the voltage comparator CMP1 and is lower than the threshold value of the voltage comparator CMP2, only the output from the voltage comparator CMP1 is converted to the potential of the power source E2 to produce a potential difference across the anode electrode A1 and filament F of the indicator tube 32. The electrons emitted from the filament F are accelerated toward the anode electrode A1 and collide therewith so as to excite and illuminate the fluorescent substance applied to this electrode A1. Similarly, when the input signal has a level higher than the threshold value of the voltage comparator CMP(n−1) and lower than the threshold value of the voltage comparator CMPn, each of the outputs of the voltage comparators CMP1, CMP2 ... and CMP(n−1) has a potential equivalent to that of the power source E2, and the fluorescent substance of the anode electrodes A1 ... A(n−1) of the fluorescent indicator tube 32 is illuminated.

Since the electrodes illuminated vary according to the magnitude of the signal level applied to the terminal 31 in the above described manner, by forming the anode electrodes A1 ... and A(n−1) of the indicator tube 32 into rectangular shapes and arranging them laterally in one row as shown in FIG. 12, the electrodes A1 ... and A(n−1) are sequentially illuminated from left to right at equal brightness (if voltage drop through the diode D1 is neglected) as the signal level increases, and the level indication is effected by the number of the electrodes thus illuminated.

When the input signal level is further increased and exceeds the threshold value of the voltage comparator CMPn, the voltage comparator CMPn starts functioning. A voltage equal to the power source E3 is obtained at the output of comparator CMPn. Thus the voltage of the power source E3 is applied to the anode electrode A(n−1) of the fluorescent indicator tube 32, whereby the illumination brightness of the fluorescent indicator tube 32 is made approximately proportional to the potential difference across the filament F and the anode electrodes, with a consequent higher illumination brightness of the anode electrode A(n−1) than that of the other anode electrodes A1 ... and A(n−2). Therefore, if it is arranged so that the voltage comparator CMP(n−1) functions at the maximum value of signal level the indicating device is intended to indicate and that the anode electrode A(n−1) is illuminated by the voltage of the power source E2, the illumination brightness of the anode electrode A(n−1) becomes particularly stronger than that of the other electrodes when the signal has a level higher than the maximum value to clearly visually indicate that the input exceeds the maximum value.

Note here that the fluorescent indicator tube described as employed in the above fourth embodiment may also be replaced by other indicating means, for example, light emitting diodes, liquid crystal displays or the like depending on necessity.

As is clear from the foregoing description, when the level indicating device according to the fourth embodiment of the present invention is used to indicate the recording level, for example, of a magnetic recording and reproducing apparatus, if the level at which the indicating element of the highest order is illuminated with the same brightness as that of the other indicating elements is set to be the maximum for proper recording level, it is possible to observe "over-level" at a glance when the illuminating brightness of the indicating element of the highest order is intensified for achieving the proper recording level.

Figure 13:
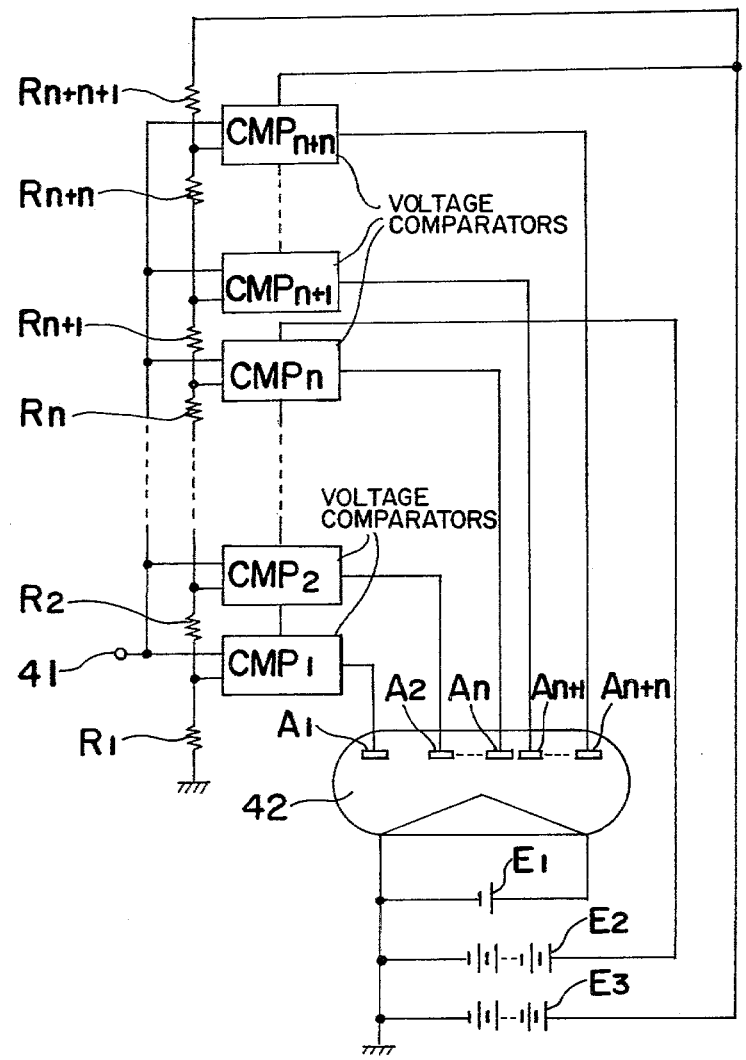
FIG. 13 is a circuit diagram similar to FIG. 2, which particularly shows a fifth embodiment thereof.
Figure 14:
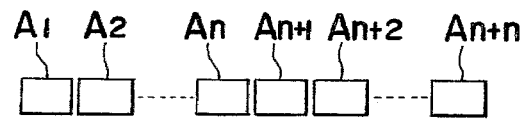
FIG. 14 is a schematic diagram showing the arrangement of electrodes of the fluorescent indicator tube employed in the circuit of FIG. 13.

Referring to FIGS. 13 and 14, there is shown a fifth embodiment of the level indicating device according to the present invention which is intended to illuminate anode electrodes corresponding to the input signal level by connecting a plurality of terminals of a fluorescent indicator tube to the output terminals of a plurality of voltage comparators whose threshold values are arranged in predetermined order. The level indicating device of the fifth embodiment as described above is arranged for effective level indication so that, on the basis of a predetermined input signal reference level, the brightness of the anode electrodes to be illuminated when the signal has a level above the reference level is made more intensive than the brightness of the anode electrodes to be illuminated when the signal has a level below the reference level.

In the circuit of FIG. 13, the threshold value setting terminals of the voltage comparators CMP1, CMP2 . . . and CMPn, and CMP(n+1) . . . and CMP(n+n) are respectively connected to potential points obtained by dividing the voltage of the DC power source E3 by the resistors R1, R2 . . . R(n+n) and R(n+1), while the signal input terminals are respectively connected to the terminal 41. An AC signal or a DC signal obtained by rectifying and smoothing the AC signal is applied to the terminal 41, and when the signal level thereof exceeds the threshold value of each of the voltage comparators, an output is produced by the respective voltage comparators CMP1, CMP2 . . . CMP(n−1) and CMPn. Since the voltage of the DC power source E2 which is applied to the voltage comparators CMP1, CMP2 . . . CMP(n−1) and CMPn is lower than that of the DC power source E3 which is applied to the voltage comparators CMP(n+1) . . . and CMP(n+n), a voltage corresponding to that of the DC power source E2 is obtained from the output terminals of the voltage comparators CMP1, CMP2 . . . CMP(n−1) and CMPn, while a voltage corresponding to that of the DC power source E3 is obtained from the voltage comparators CMP(n+1) . . . and CMP(n+n). Needless to say if the signal levels impressed upon these voltage comparators are lower than the threshold values of the respective voltage comparators, the output terminals of the voltage comparators are at ground potential. The output terminals of the voltage comparators CMP1, CMP2 . . . CMP(n−1) and CMPn are connected to respective anode electrodes A1, A2 . . . A(n−1) and An of the fluorescent indicator tube 42, while the output terminals of the voltage comparators CMP(n+1) . . . and CMP(n+n) are connected to respective anode electrodes A(n+1) . . . and A(n+n) of the fluorescent indicator tube 42. The anode electrodes of the indicator tube 42 are each formed, for example, into a rectangular shape and are laterally arranged in one row form left to right in the order A1, A2 . . . A(n−1) and An and A(n+1) . . . and A(n+2) as shown in FIG. 14. The filament F which is the cathode of the fluorescent indicator tube 42 is connected to the DC voltage source E1, with one side thereof being at ground potential.

By the above arrangement, when the signal level applied to the terminal 41 exceeds the threshold value of the voltage comparator CMP1 and is lower than the threshold value of the voltage comparator CMP2, only the output from the voltage comparator CMP1 is converted to the potential of the DC voltage source E2 thereby producing a potential difference across the anode electrode A1 and filament F. Thus the electrons emitted from the filament F are accelerated to collide with the anode electrode A1 for exciting and illuminating the fluorescent substance applied onto this electrode A1. Meanwhile, if the input signal level exceeds the threshold value of the voltage comparator CMP2, the anode electrodes A1 and A2 of the indicator tube 42 are illuminated. In a similar manner, when the signal level exceeds the threshold value of the voltage comparator CMP(n+n), all of the anode electrodes A1 . . . and A(n+n) are illuminated, whereby the magnitude of the signal level is indicated by the number of anode electrodes thus illuminated. Note that since the voltage applied to the anode electrodes A(n+1) . . . and A(n+n) of the fluorescent indicator tube 42 is set to be higher than the voltage applied to the electrodes A1, A2 . . . A(n−1) and An and since the illumination brightness of the anode electrode is approximately proportional to the potential difference between the filament F and the anode electrode, the brightness of the anode electrodes A(n+1) . . . and A(n+n) is appreciably higher than that of the electrodes A1, A2 . . . A(n−1) and An. Therefore, in the application of the indicating device of the foregoing fifth embodiment, for example, to a recording signal level indicating device for a magnetic recording and reproducing apparatus, if the anode electrodes A1, A2 . . . A(n−1) and An are arranged to be sequentially illuminated at the levels below a recording signal level of 0 dB, and the additional anode electrodes A(n+1) . . . and A(n+n) are also sequentially illuminated at the levels higher than this recording signal level, it is possible to clearly indicate that the recording signal level is higher than the reference level by the high intensity of illumination of the anode electrodes A(n+1) . . . and A(n+n) thus achieving and extremely effective indicating device for users of these magnetic recording and reproducing apparatuses.

As is seen from the foregoing description, according to the arrangement of the fifth embodiment of the present invention, since the magnitude of the signal level is clearly indicated by the number of anode electrodes illuminated, a very effective level indication is made possible. Furthermore, by arranging on the basis of a predetermined reference level for the brightness of the anode electrodes illuminated by signal levels above the reference level to be more intensive than the brightness of the anode electrodes illuminated by signal levels below the reference level, it is possible to simultaneously indicate whether the particular signal level is less than the reference level or higher than this reference level in a manner most particularly suited for recording level indication of magnetic recording and reproducing apparatus.

Figure 15:
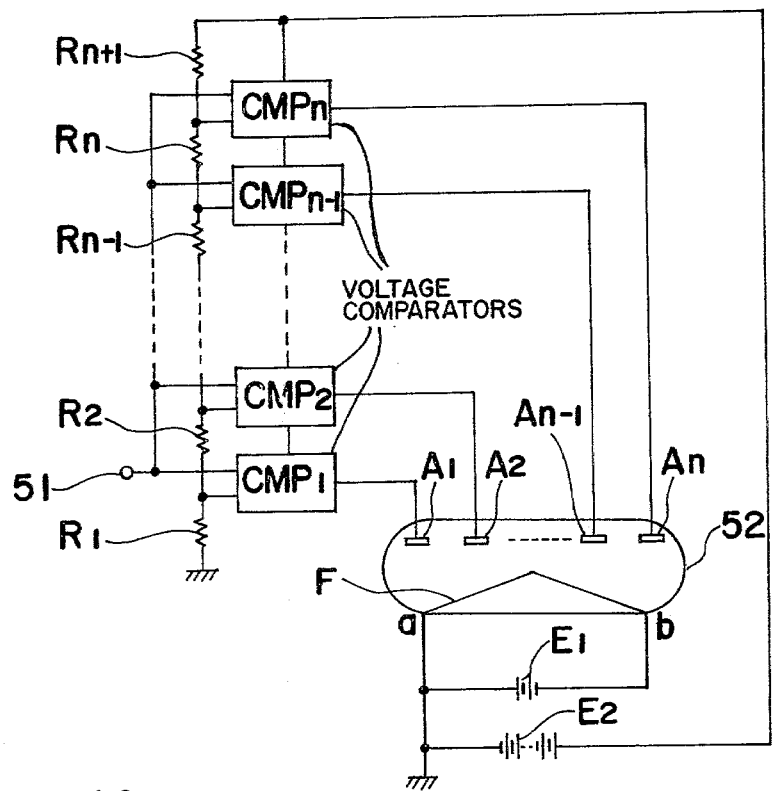
FIG. 15 is a circuit diagram similar to FIG. 2, which particularly shows a sixth embodiment thereof.
Figure 16:
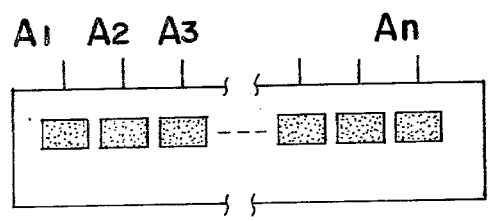
FIG. 16 is a schematic front view of the fluorescent indicator tube employed in the circuit of FIG. 15.

Referring now to FIGS. 15 and 16 showing a sixth embodiment of the present invention, the level indicating device is arranged such that the anode terminals of the fluorescent indicator tube are connected to the output terminals of a plurality of voltage comparators each arranged in order according to their respective threshold values for illuminating the anode portions corresponding to the input signal level, with the intention of varying the illumination intensity of the anode portions in correspondence to the input signal level.

In the circuit of FIG. 15, the threshold value setting terminals of the voltage comparators CMP1, CMP2 . . . CMP(n−1) and CMPn are respectively connected to potential points obtained by dividing the voltage of the DC power source E2 by the resistors R1, R2 . . . R(n−1), Rn and R(n+1), while the signal input terminals are all connected to the terminal 51. An AC signal or a DC signal obtained by rectifying and smoothing the AC signal is applied to the terminal 51. When the signal level exceeds the threshold value of each of the voltage comparators, the outputs produced by the voltage comparators CMP1, CMP2 . . . CMP(n−1) and CMPn are at the level of the voltage of the DC power source E2. On the other hand, if the signal level impressed upon these voltage comparators is lower than the threshold values of the respective voltage comparators, the outputs from these voltage comparators are of ground potential. The output terminals of the voltage comparators CMP1, CMP2 ... CMP(n−1) and CMPn are connected to respective anode electrodes A1, A2 ... A(n−2) and An of the fluorescent indicator tube 52. The filament electrode F is disposed in a position confronting the electrodes A1, A2 ... A(n−1) and An, and is connected at its terminal a opposite anodes illuminated at low signal levels to ground and at its terminal b opposite anodes illuminated at high signal levels to the negative terminal of the DC power source E1. The positive terminal of the DC power source E1 is grounded.

By the above arrangement, when the outputs of voltage comparators CMP1 ... CMPi (where $1 \leq i \leq n$) are converted to the potential of the power source E2 sequentially from the lower order by the signal applied to the terminal 51, the potential of the anode electrodes A1 ... and Ai becomes higher than the filament potential E1 of the fluorescent indicator tube 52. Thus electrons emitted from the filament collide with the anode electrodes A1 ... and Ai to excite and to illuminate the fluorescent substance applied to these anode electrodes. In this case, if the anode electrodes are each formed, for example, into rectangular shape and laterally arranged in one row as shown in FIG. 16, the anode electrodes are sequentially illuminated from the left as the signal level increases for a definite and clear level indication.

Since the illumination brightness of the anode electrodes A1, A2 ... A(n−1) and An is proportional to the potential difference between the filament F and the anode electrodes, the brightness increases as this potential difference becomes larger. In the anode electrode A1 which is illuminated at low signal levels, the potential difference with respect to the filament F is approximately equal to the potential of the DC power source E2, whereas the potential difference between each of the anode electrodes and filament electrode F is increased toward the anode electrodes A2 ... and An which are illuminated at higher signal levels, and reaches a value nearly equal to the potential of the DC power source E1 plus the DC power source E2 at the anode electrode An.

Accordingly, the brightness of the anode electrodes A1, A2 ... A(n−1) and An increases in the order A1 to An, and the higher the signal level applied to the terminal 51, the brighter is the illumination.

As is clear from the above description, according to the arrangement of the sixth embodiment of the present invention as described above, the intensity of illumination of the indicator tube is increased as the signal level is increased from the lower levels to the higher levels. Thus it is possible to visually impress users with the magnitude of the signal level by the illumination of a number of electrodes corresponding to the signal level magnitude and simultaneously the variation of the intensity of illumination, making it easy for the users to make adjustments to select the optimum signal level.

Figure 17:
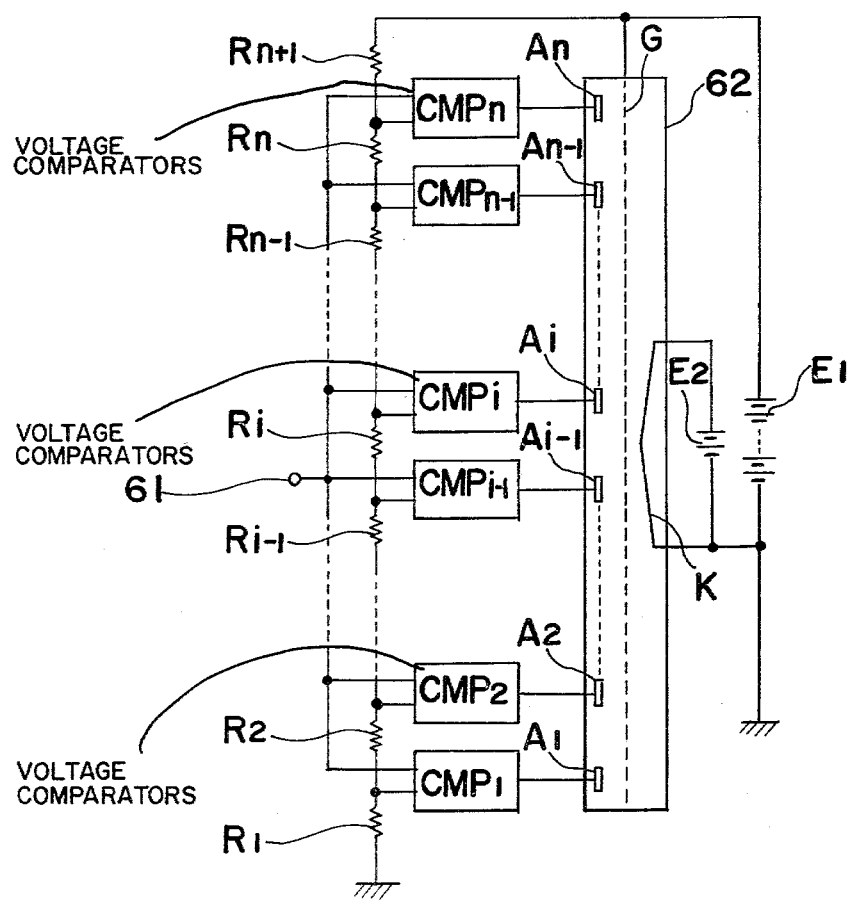
FIG. 17 is a circuit diagram similar to FIG. 2, which particularly shows a seventh embodiment thereof.
Figure 18:
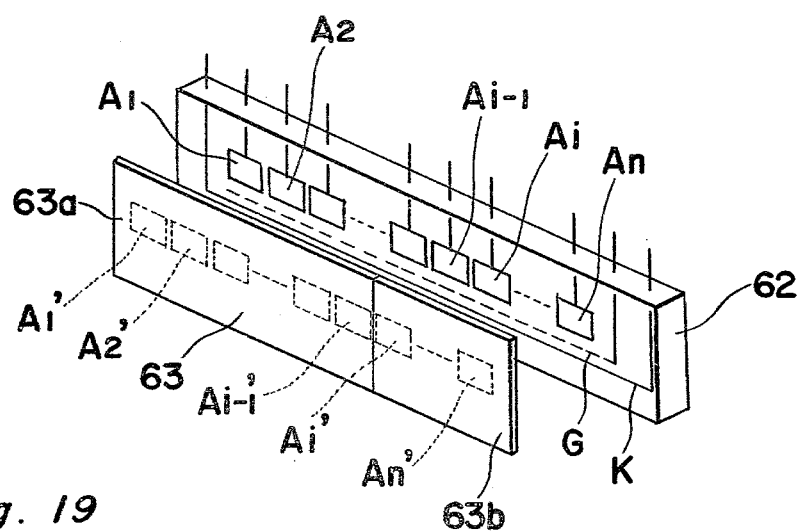
FIG. 18 is an exploded perspective view of the indicating portion employed in the circuit of FIG. 17.
Figure 19:
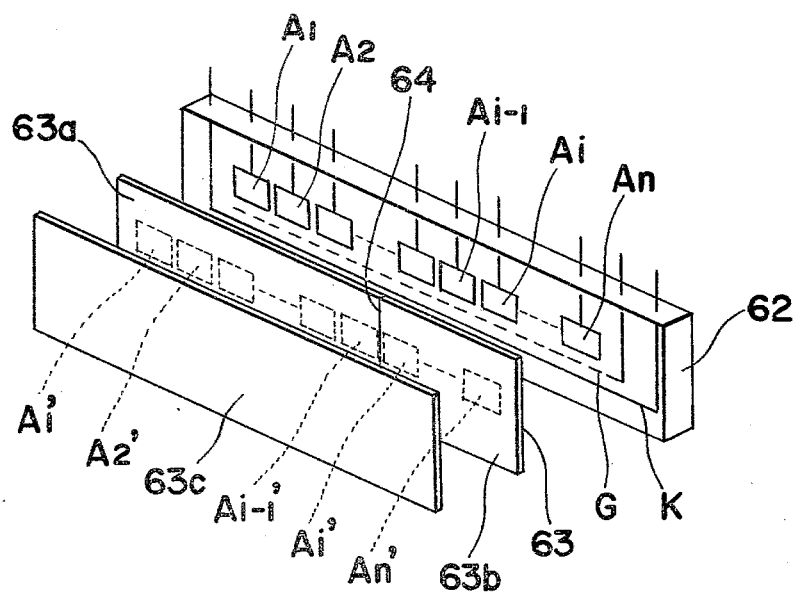
FIG. 19 is a view similar to FIG. 18, which particularly shows another example thereof.

Referring to FIGS. 17 to 19 showing a seventh embodiment of the present invention, the level indicating device is arranged for effective level indication by visually altering the colors of a plurality of illuminating portions illuminated upon receipt of signals having levels below a reference level and the colors of a plurality of illuminating portions illuminated upon receipt of signals having levels above this reference level.

In the circuit of FIG. 17, the threshold value setting terminals of the voltage comparators CMP1, CMP2 ... CMP(n−1) and CMPn are respectively connected to potential points obtained by dividing the voltage of the DC power source E1 by the resistors R1, R2 ... R(n−1), Rn and R(n+1), while the signal input terminals are respectively connected to the terminal 61. An AC signal or a DC signal obtained by rectifying and smoothing the AC sigal is applied to the terminal 61, and when the signal level exceeds the threshold value of each of the voltage comparators, outputs are produced from the respective voltage comparators CMP1, CMP2 ... CMP(n−1) and CMPn. Since the voltage of the DC power source E1 is applied to the voltage comparators CMP1, CMP2 ... CMP(n−1) and a voltage corresponding to that of the DC power source E1 is obtained at the output of each of these voltage comparators. Needless to say if the signal level impressed upon these voltage comparators is lower than the threshold values of the respective voltage comparators, the outputs of the voltage comparators are at ground potential. The output terminals of the voltage comparators CMP1, CMP2 ... CMP(n−1) and CMPn are connected to respective anode electrodes A1, A2 ... (n−1) and An of the fluorescent indicator tube 62, while the grid G of the indicator tube 62 is connected to the DC power source E1 and the cathode K is connected to the DC voltage source E2. The anode electrodes A1, A2 ... A(n−1) and An of the fluorescent indicator tube 62 are each formed, for example, into a rectangular shape and are laterally arranged in one row from left to right as shown in FIG. 18. There is disposed, in front of the fluorescent indicator tube 62, a filter member 63 including a first filter plate 63a and a second filter plate 63b which adjoin each other in a position between the anode electrode A(i−1) and Ai in the row of the anode electrodes A1, A2 ... A(n−1) and An.

By the above arrangement, when the signal level applied to the terminal 61 exceeds the threshold value of the voltage comparator CMP1 and is lower than the threshold value of the voltage comparator CMP2, only the output from the voltage comparator CMP1 is converted to the potential of the DC voltage source E1 thereby producing a potential difference across the anode electrode A1 and cathode K. Thus the electrons emitted form the cathode K are accelerated by the grid G to collide with the anode electrode A1 for exciting and illuminating the fluorescent substance applied to said electrode A1. In this case, the anode electrode thus illuminated presents different color depending on the shade of the filter plate 63a of the filter member 63 when observed from outside. Meanwhile, if the input signal level exceeds the threshold value of the voltage comparator CMP2, the anode electrodes A1 and A2 of the indicator tube 62 are illuminated, and in a similar manner, when the signal level exceeds the threshold value of the voltage comparator CMPn, all of the anode electrodes A1, A2 ... A(n−1) and An are illuminated, whereby the magnitude of the signal level is indicated by the number of the anode electrodes thus illuminated.

Note here that the illumination color of the anode electrodes A1, A2 ... A(n−1) and An of the indicator tube 62 is determined by the filter member 63. By arranging the illuminated color A'1 ... and A'(i−1) of the anode electrodes A1 ... and A(i−1) to be different from the illuminated color A'i ... and A'n of the anode electrodes Ai ... and An, for example, by properly selecting the filter plates 63a and 63b such that the color due to illumination of the electrodes A1 ... and A(i−1) appears green or light blue and the color due to illumination of the electrodes Ai ... and An appears red or colors close to the red, it is possible to visually draw attention to the fact that the signal is at a high level.

Accordingly, in the application of the above seventh embodiment, for example, to a level indicating device of the recording signal level of a magnetic recording and reproducing apparatus, if it is arranged to set a predetermined reference level (0 dB) between the voltage comparators CMP(i−1) and CMPi, the anode electrodes A1 ... and A(i−1) are sequentially illuminated at the levels below this recording reference level (0 dB) and the additional anode electrodes Ai ... and An are also sequentially illuminated at the levels above this recording reference level. Thus a recording signal level which exceeds the reference level can be visually indicated, since the color of light passing through the filter member 63 for the anode electrodes Ai ... and An differs from the color passing through the filter member 63 for the anode electrodes A1 ... and A(i−1), thereby providing an extremely effective level indication to operators of these magnetic recording and reproducing apparatuses.

In FIG. 19, there is shown a modification of the filter and fluorescent indicator tube arrangement of FIG. 18. In this modification, another filter plate 63c having a comparatively dark shade is applied onto the outer surfaces of the filter plates 63a and 63b for covering the junction 64 between the filter plates 63a and 63b so as to render it externally invisible. In the above modification also, the illumination color of the electrodes A1 ... and A(i−1) and the color of the electrodes Ai ... and An still appear different from each other due to the presence of the filter plates 63a and 63b which vary the color of illumination of the electrodes in the manner as described earlier. Needless to say the fluorescent indicator tube described as employed in the foregoing embodiments may be replaced by indicating elements of other construction, for example, light emitting diodes or the like.

As is clear from the foregoing description, in the level indicating device according to the seventh embodiment of the present invention which is arranged to clearly indicate the magnitude of the signal level by the number of illuminated indicating elements, it is possible to effect an extremely effective level indication. Furthermore, by arranging on the basis of a predetermined reference level for the color of the indicating elements illuminated at signal levels below the reference level and the color of the indicating elements illuminated at signal levels above the reference level to be different from each other as observed externally by the presence of the filter plates, it is possible to simultaneously indicate whether the signal level is above or below the reference level very effectively. Moreover, if the filter member is constituted by three filter plates as described with reference to the modification of FIG. 19, the junction of the filter plates may be kept out of sight to provide an indicating device of good appearance and advantageously employable, for example, for magnetic recording and reproducing apparatuses.

Referring to FIGS. 20 to 24, there is shown an eighth embodiment of the level indicating device according to the present invention which may also be applied to various acoustic appliances such as magnetic recording and reproducing apparatuses, stereophonic reproducing apparatuses, radio receiving sets, transmitters and receivers for communication purposes, etc., for effecting an indication of the operating condition of the operating members through simple construction. More specifically, in the application of the level indicating device, for example, to a magnetic recording and reproducing apparatus, the indicating device of the invention may be arranged so that with the employment of a fluorescent indicator tube for level indication of signals, such as reproduced signals, recording signals, etc., various indications, for example, of the operating condition of a tape selection operating switch, i.e., indications for NORMAL, $CrO_2$, $Fe-CrO_2$ and the like, of the time constant such as EQ 70$\mu$, EQ 120$\mu$, etc. for an equalizer related to the selected positions of the above tape selection operating switch, of the operating condition of a bias change-over switch such as BIAS LOW, BIAS HIGH, and the like, of the operating condition of a plurality of tape running control push buttons, i.e., indications for PLAY, REC, FF, REW, PAUSE, STOP and the like, are efficiently made through simple construction of the indicating device.

Figure 20:
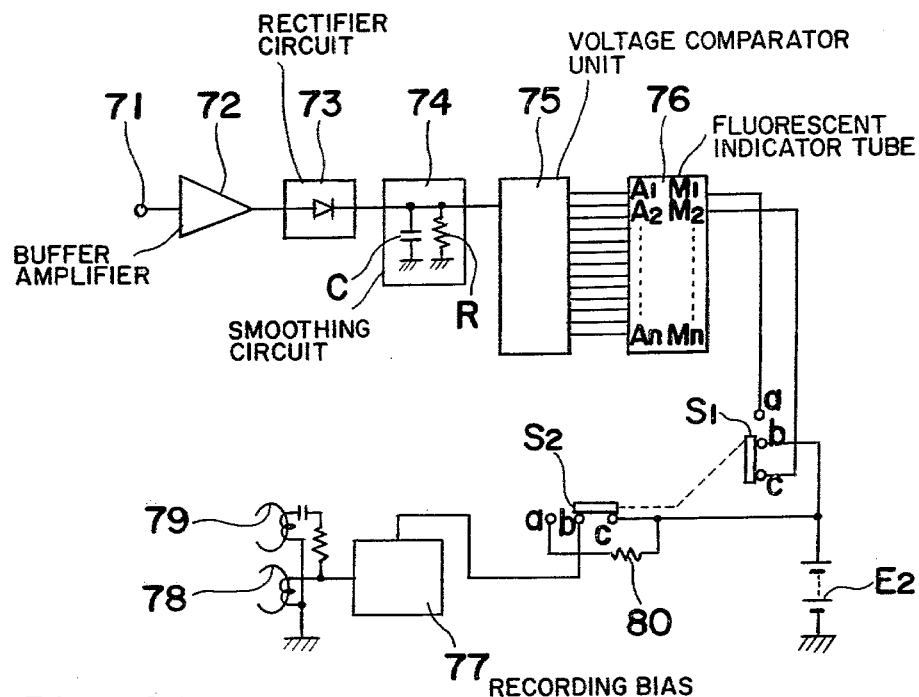
FIG. 20 is a block diagram similar to FIG. 1, which particularly shows an eighth embodiment thereof.

In the block diagram of FIG. 20 showing an arrangement according to the present invention as applied to a fundamental circuit of a magnetic tape recording and reproducing apparatus a signal, for example, a reproduced signal, a recording signal or the like is applied to an input terminal 71 of a buffer amplifier 72 for proper amplification and impedance conversion of this signal. The output terminal of the amplifier 72 is coupled, to a rectifier circuit 73 which rectifies the output signal of the amplifier 72 into a DC signal. The output terminal of the rectifier circuit 73 connected to a smoothing circuit 74 for smoothing the output from the rectifier circuit 73. The smoothing circuit includes a smoothing capacitor C and a resistor R and by properly setting the time constant of the combination of C and resistor R the indicating response characteristics of a later mentioned indicator are properly set. Note that the connections of the capacitor C and resistor R may be modified in various ways in a known manner. The output terminal of the smoothing circuit 74 is coupled to a voltage comparator unit 75 including a plurality of voltage comparators, the output terminals of which are applied to respective level indicating anode electrodes A1, A2 ... A(n−1) and An of a fluorescent indicator tube 76. The fluorescent indicator tube 76 has another set of anode electrodes M1, M2 ... M(m−1) and Mm for indicating the operating condition of the operating members separately from the level indicating anode electrode A1, A2 ... A(n−1) and An, and the voltage from the DC power source E2 is arranged to be supplied to the anode electrodes M1, M2 ... M(m−1) and Mm through switches, although connections only for the electrodes M1 and M2 are shown in FIG. 20 for brevity. More specifically, it is arranged so that the voltage from the DC power source E2 is selectively applied to the anode electrodes M1 and M2 through a change-over switch S1 which is changed over in association with a bias change-over switch S2 which changes over the output of a recording bias oscillator 77 to which an erasing head 78 and a recording head 79 are coupled by coupling the power source voltage of the recording bias oscillator 77 through a resistor for reducing the output level of the oscillator 77.

Figure 21:
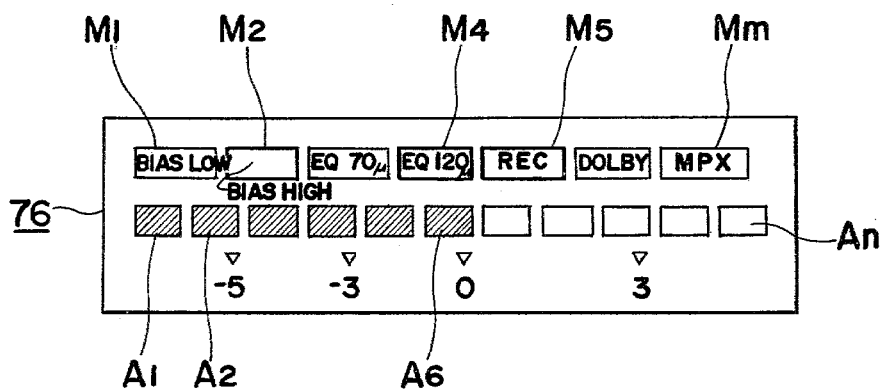
FIG. 21 is a front view showing the indicator surface of the fluorescent indicator tube employed in the arrangement of FIG. 20.

On the indicating surface of the fluorescent indicator tube 76, the level indicating anode electrodes A1, A2 . . . A(n−1) and An are laterally arranged in one row, while the operating condition indicating anode electrodes M1, M2 ... M(m−1) and Mm are also laterally arranged in one row above the electrodes A1, A2 ... A(n−1) and An in a direction parallel to the latter as illustrated in FIG. 21. Graduations and corresponding numerals are provided below the electrodes A1, A2 ... A(n−1) and An. The electrodes M1, M2 ... M(m−1) and Mm are respectively marked with letters or symbols, for example, BIAS LOW, BIAS HIGH, etc. for indicating the degree of the recording bias levels, EQ 70μ, EQ 120μ and the like for indicating the time constant of the equalizer, REC for indicating the recording condition, DOLBY for indicating the operation of a noise reduction circuit, MPX for indicating the operation of a multiplex circuit, etc.

Accordingly, in FIG. 20, with the tape recording and reproducing apparatus set in the recording condition, when a recording signal whose level is to be indicated is applied to the input terminal 71 and a voltage exceeding the threshold values of the first to sixth voltage comparators is developed at the output terminal of the smoothing circuit 74, the anode electrodes A1, A2 ... and A6 are illuminated to clearly show the user that the level of the input signal is 0 DB. Note that in FIG. 21, the anode electrodes which are illuminated are hatched. In the state as described above, if the switches S1 and S2 shown in FIG. 20 are positioned to connect their respective contacts b and c, the voltage from the DC voltage source E2 is applied directly to the power supply applying terminal of the bias oscillator 77 without passing through the resistor 80. The output level of the bias oscillator 77 becomes high as compared with the case in which the resistor 80 is interposed in the power source line. Simultaneously the voltage of the DC power source E2 is supplied to the anode electrode M2 through the switch S1 to illuminate the indicating symbol BIAS HIGH of the electrode M2. Note that the symbols BIAS HIGH, EQ 120μ, and REC may thus be illuminated and their corresponding bold letters thus made visible. Moreover, since the number of level indicating electrodes illuminated increases or decreases in correspondence with any change of the input signal level, the rows of the anode electrodes present an appearance as if the lengths of illuminated lines were varied, thus the scale may be read off comparatively easily.

Figure 22:
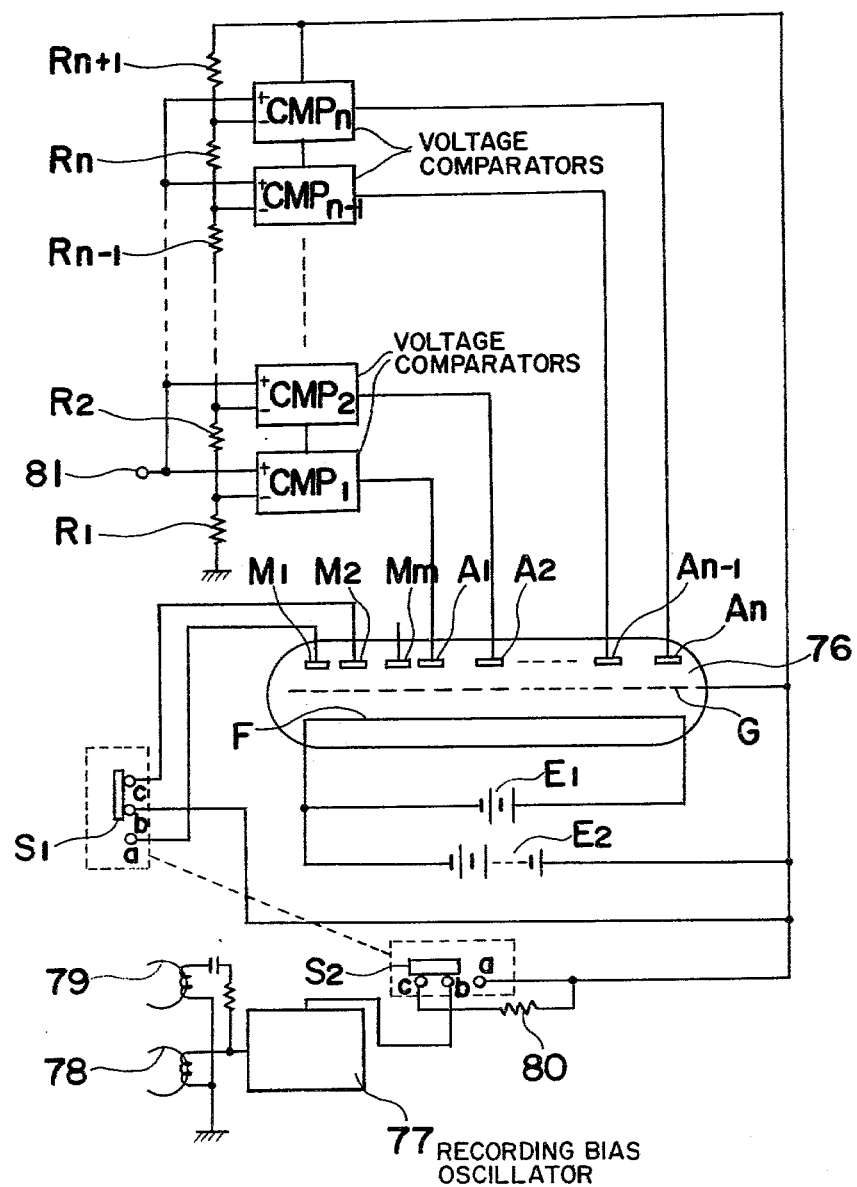
FIG. 22 is an electrical circuit diagram showing the connections at a main portion of the arrangement of FIG. 20.

In the circuit of FIG. 22 in which the circuit construction beyond the voltage comparator unit 75 is shown more specifically, a terminal 81 to which the output of the smoothing circuit 74 (FIG. 20) is applied is coupled to the positive input terminals of the voltage comparator CMP1 CMP2 ... CMP(n−1) and CMPn as shown. The negative terminals which are the threshold value setting terminals of the voltage comparators CMP1, CMP2 ... CMP(n−1) and CMPn are connected to respective potential points obtained by dividing the voltage of the DC voltage source E2 by the resistance R1, R2 ... R(n−1), Rn and R(n+1). More specifically, connections are so made that for example, the threshold value of the voltage comparator CMP1 is equivalent to the voltage across the resistor R1, and the threshold value of the voltage comparator CMP2 is equivalent to the voltage across the series combination resistance of the resistors R1 and R2. The power for the plurality of voltage comparators is supplied from the DC power source E2. Accordingly, when the DC signal level applied to the terminal 81 exceeds the threshold value of each of the voltage comparators, the output from that particular voltage comparator is the level of the DC power source voltage E2, while if the DC signal level goes below this threshold value, the output is reduced to the ground level.

The output terminals from the plurality of voltage comparators are coupled to the level indicating anodes A1, A2 ... A(n−1) and An of the fluorescent indicator tube 76, while the grid electrode G of the tube 76 is connected to the DC voltage source E2 and the filament F is connected to the DC voltage source E1. The operation indicating anode electrode M1 is connected to the DC voltage source E2 through the switch S1. Therefore, if the outputs of the voltage comparators CMP1 to CMPi (where 1≦i≦n) from the lower order are converted from ground potential to the potential of the power source E2, the potentials of the grid electrode G and anode electrodes A1 ... Ai and M1 become higher than the potential at the filament F of the indicator tube 76, and the electrons emitted from the filament F are further accelerated by the grid electrode G to collide the anode electrodes A1 ... Ai and M2 to excite and to illuminate the fluorescent substance applied to these electrodes. Note that the level indicating anode electrodes A1, A2 ... A(n−1) and An have the fluorescent substance applied over their entire surfaces, while the electrodes M1, M2 ... M(m−1) and Mm have this fluorescent substance applied only at portions having the symbols and numerals to provide the indication as described with reference to FIG. 21.

Figure 23:
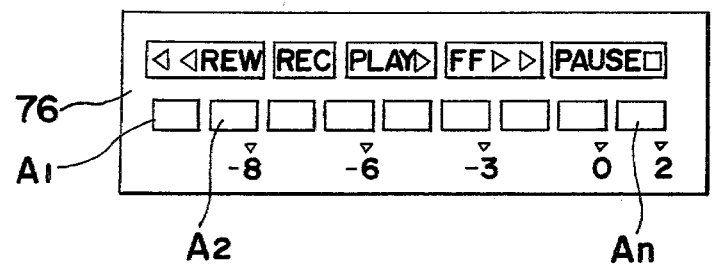
FIG. 23 is a view similar to FIG. 21, which particularly shows another example thereof.
Figure 24:
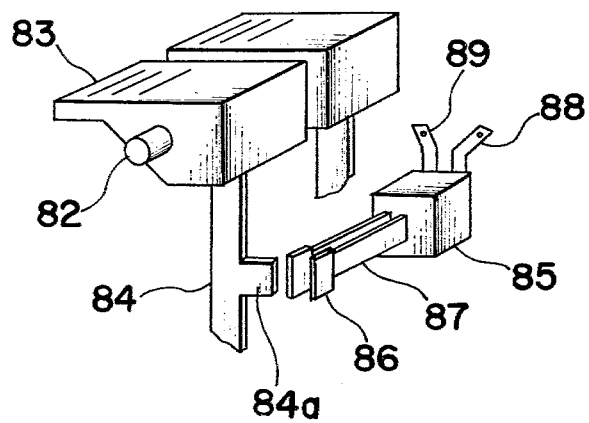
FIG. 24 is a perspective view showing, on an enlarged scale, the structure of the tape running operation push button employed in the arrangement of FIG. 20.

In FIG. 23, there is shown a modification of the indicating surface of the indicator tube. In this modification, anode electrodes having thereon indication symbols for indicating the tape running modes such as REW for rewinding, REC for recording, PLAY for reproducing, FF for fast forwarding, and PAUSE for temporarily stopping are arranged above the level indicating anode electrodes A1, A2 ... A(n−1) and An, and these tape running mode indicating electrodes are illuminated corresponding to the operation of each of the tape running push buttons, one example of which is shown in FIG. 24. In FIG. 24, when a push botton 83 pivotally mounted on a shaft 82 is depressed downward, a rod 84 secured to the push button 83 and extending downwardly from the button 83 is rotated counterclockwise about the shaft 82 for changing over the tape running mechanism (not shown) to cause the tape to run as desired. In this case, a projection 84a provided on one edge of the rod 84 depresses the insulating plates 86 secured to the forward ends of two metal plates 87 extending from a leaf switch 85 to bring the plates 87 into contact with each other, thus electrically connecting terminals 88 and 89 leading from these metal plates 87. This state is maintained until the push button 83 is returned to the original position due to depression of other push buttons. By providing a leaf switch similar to the leaf switch 85 as described above for each of the push buttons, with the DC power source E2 being connected to one of the terminals 89 or 88 of each of the leaf switches and the tape running mode indication anode electrodes connected to the other of the terminals 89 or 88, the tape running mode symbol formed on the corresponding anode electrode of the indicator is illuminated by the power source E2, since the power of the power source E2 is only supplied to the other terminal of the leaf switch corresponding to the depressed push button.

Note that in the above eighth embodiment of the present invention, although the arrangement of the invention is mainly described with reference to a magnetic tape recording and reproducing apparatus, the concept of the present invention is not limited in its application to such a magnetic tape recording and reproducing apparatus, but may be readily applied to various other types of acoustic appliances for indicating the states of operation of the operating members.

As is clear from the foregoing description, in the eighth embodiment of the present invention, since the plurality of anode electrodes provided in the fluorescent indicator tube for indicating the operating conditions of the operating members are arranged to be illuminated in correspondence to each of these operating conditions, it is possible to readily effect a number of indications, with simple construction and consequent facilitation in assembly of this indicating device during its manufacture as compared with the conventional arrangement employing a plurality of lamps for the indication. Furthermore, in the arrangement of the present invention, each of the operating conditions can be collectively watched in one place, with a simultaneous level indication at the same indicating plane, and therefore, overall control of the acoustic appliance is easily made in a limited space in an efficient manner.

Figure 25:
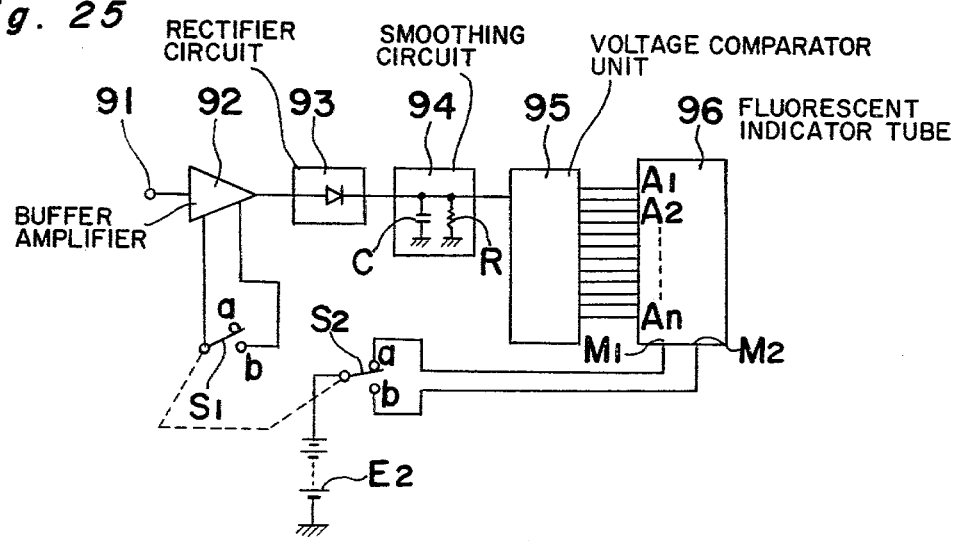
FIG. 25 is a block diagram similar to FIG. 1, which particularly shows a ninth embodiment thereof.
Figure 26:
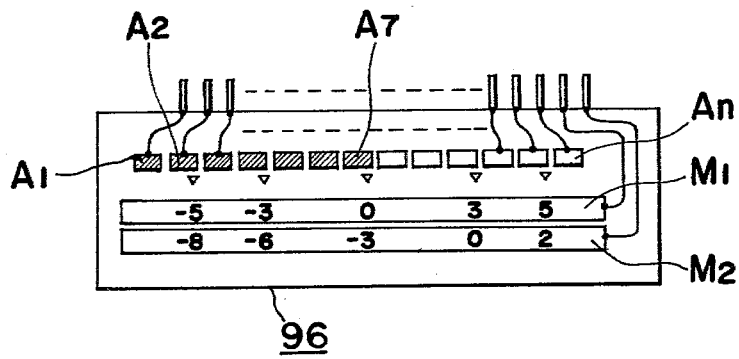
FIG. 26 is a schematic front view of the fluorescent indicator tube employed in the arrangement of FIG. 25.
Figure 27:
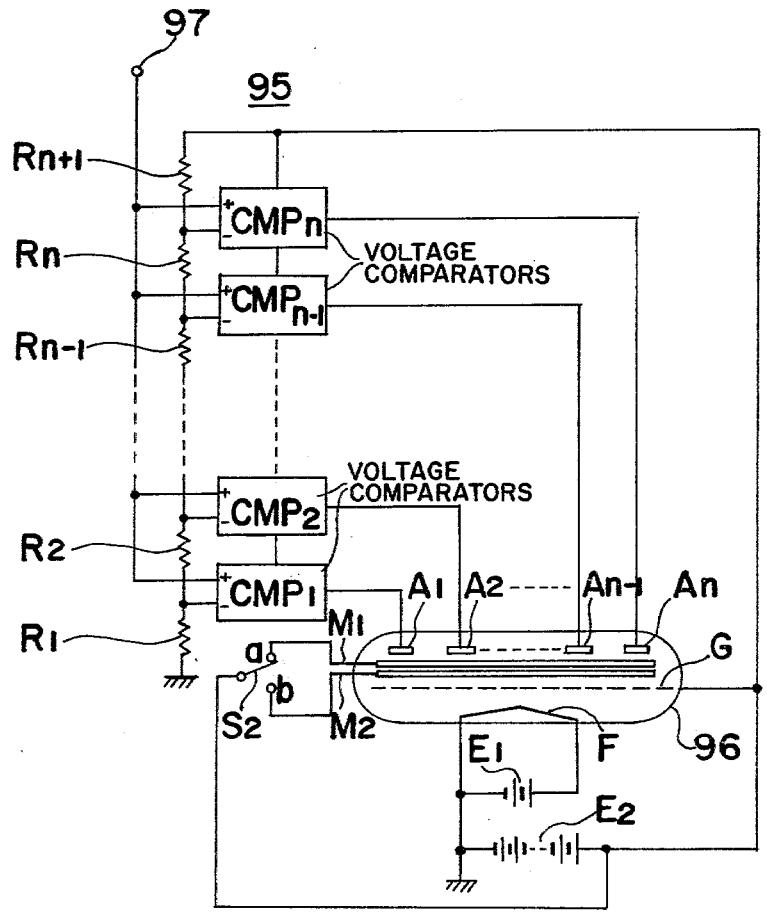
FIG. 27 is an electrical circuit diagram showing the connections at main portions of the arrangement of FIG. 25.

Referring to FIGS. 25 to 27, there is shown a level indicating device according to a ninth embodiment of the present invention. The level indicating device is provided with a plurality of scale graduations which are readily readable for eliminating wrong reading of these graduations, with accurate response to signals whose levels are to be indicated.

In the block diagram of FIG. 25, showing an arrangement according to the present invention as applied to a fundamental circuit of a magnetic tape recording and reproducing apparatus, a signal, for example, a reproduced signal, a recording signal or the like is applied to an input terminal 91 of a buffer amplifier 92 for proper amplification and impedance conversion of this signal. The output terminal of the amplifier 92 is coupled to a rectifier circuit 93 which rectifies the output signal of the amplifier 92 into a DC signal. The amplifier 92 is provided with a tape select switch S1 for changing over the amplification of the amplifier 92 according to the sensitivity of the magnetic tape. The output terminal of the rectifier circuit 93 is connected to a smoothing circuit 94 for smoothing the output from the rectifier circuit 93. The smoothing circuit includes a smoothing capacitor C and a resistor R and by properly setting the time constant of combination of capacitor C and resistor R, the indicating response characteristics of the indicator mentioned later are properly set. Note that the connections of the capacitor C and resistor R may also be modified in various ways in a known manner. The output terminal of the smoothing circuit 94 is coupled to a voltage comparator unit 95 including a plurality of voltage comparators, the output terminals of which are connected to respective level indicating anode electrodes A1, A2 ... A(n−1) and An of the fluorescent indicator tube 96. The fluorescent indicator tube 96 has set of graduation anode electrodes M1 and M2 for scale indication separate from the level indicating anode electrode A1, A2 ... A(n−1) and An. The voltage from the DC power source E2 is arranged to be selectively supplied to the anode electrodes M1 and M2 by a change-over switch S2 which is switched over in association with the earlier mentioned switch S1. Note that the change-over of the above mentioned change-over switches S1 and S2 may be effected manually or automatically through detection, for example, of recesses for automatic change-over or the like provided in a tape cassette.

On the indicating surface of the fluorescent indicator tube 96, the level indicating anode electrodes A1, A2 ... A(n−1) and An of rectangular shape are laterally arranged in one row, the graduations of indicating anode electrodes M1 and M2 are also laterally arranged in rows below the electrodes A1, A2 ... A(n−1) and An in a direction parallel to the latter. The electrodes M1 and M2 are respectively marked with numerals for graduations ranging from −5 dB to 5 dB and from −8 dB to 2 dB (FIG. 26).

Accordingly, in FIG. 25, when a signal whose level is to be indicated is applied to the input terminal 91 and a voltage exceeding the threshold values of the first to seventh voltage comparators is developed at the output terminal of the smoothing circuit 94 at a certain time, the anode electrodes A1, A2 ... A7 are illuminated as shown in hatched lines by the FIG. 26. In the state as described above, if the switches S1 and S2 shown in FIG. 25 are connected to the contact a sides respectively, the graduation numerals for only the electrode M1 of the graduation electrodes M1 and M2 is illuminated as shown in FIG. 26 for clearly indicating that the input signal level is 0 dB. Moreover, since the number of illuminated level indicating electrodes increases or decreases in correspondence with any change of the input signal level, the row of the anode electrodes presents an appearance as if the length of an illuminated line were varied, thus the scale is read off comparatively easily.

In the circuit of FIG. 27 in which the circuit construction beyond the voltage comparator unit 95 in FIG. 25, is shown more specifically, the output terminal 97 of the smoothing circuit 94 of FIG. 26 is coupled to the positive input terminals of the voltage comparators CMP1, CMP2 ... CMP(n−1) and CMPn as shown. The negative terminals which are the threshold value setting terminals of the voltage comparators CMP1, CMP2 ... CMP(n−1) and CPMn are connected to respective potential points obtained by dividing the voltage of the DC voltage source E2 by the resistance R1 ... and R(n+1). More specifically, connections are so made that for example, the threshold value of the voltage comparator CMP1 is equivalent to the voltage across the resistor R1, and the threshold value of the voltage comparator CMP2 is equivalent to the voltage across the series combination resistance of the resistors R1 and R2. The power for the plurality of voltage comparators is supplied from the DC power source E2. Accordingly, when the DC signal level impressed on the terminal 97 exceeds the threshold value of each of the voltage comparators, the output from that particular voltage comparator is the level of the DC power source voltage E2, while if the DC signal level goes below the threshold value, the output is reduced to the ground level.

Figure 28:
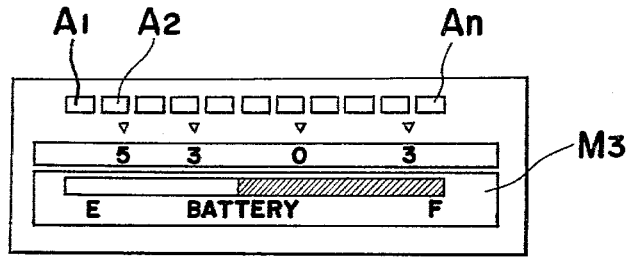
FIG. 28 is a view similar to FIG. 26, which particularly shows another example thereof.

The output terminals from the plurality of voltage comparators are coupled to respective level indicating anodes A1, A2 ... A(n−1) and An of the fluorescent indicator tube 96, while the grid electrode G of the tube 96 is connected to the DC voltage source E2 and the filament F is connected to the DC voltage source E1. The graduation anode electrode M1 is connected to the DC voltage source E2 through the switch S1. Therefore, if the outputs of the voltage comparators CMP1 to CMPi (where $1 \leq i \leq n$) from the lower order are converted from the ground potential to the potential of the power source E2, the potentials of the grid electrode G and anode electrodes A1 ... Ai and M1 become higher than the potential at the filament of the indicator tube 96, and the electrons emitted from the filament F are further accelerated by the grid electrode G to collide the anode electrodes A1 ... Ai and M2 to excite and illuminate the fluorescent substance applied to these electrodes. Note that the level indicating anode electrodes A1, A2 ... A(n−1) and An have the fluorescent substance applied over their entire surfaces, while the electrodes M1 and M2 have such fluorescent substance applied only at portions having the graduation numerals to provide the indication as described with reference to FIG. 26. Note here that another anode electrode M3 for checking the voltage of a battery may be further provided in the fluorescent indicator tube for applying a predetermined voltage to the electrode during the voltage check as shown in FIG. 28.

As is clear from the foregoing description, in the level indicating device according to the eighth embodiment of the present invention, only the selected graduations of the plurality of graduations are illuminated for observation, and thus the reading can be readily taken without any possibility of erroneous readings. Moreover, since a fluorescent indicator tube is employed as the indicator, level indication correctly following the signals to be indicated is advantageously effected with substantial elimination of the disadvantages inherent in the conventional meters of entirely mechanical structure such as delay due to rise time or "over shooting" of pointer needles. Furthermore, the fluorescent indicator tube is of simple construction, can be readily manufactured and is free from breakage or malfunction due to external vibrations and the like.

Referring to FIGS. 29 to 33 showing a level indicating device according to a tenth embodiment of the present invention, the indicating device disclosed is intended for use, for example, as a level indicator of a magnetic tape recording and reproducing apparatus and is arranged to make it possible to clearly read the average level and the peak level of the signal to be indicated.

In the conventional level indicating devices of the kind, for example, used in magnetic tape recording and reproducing apparatuses, it has generally been arranged so that the average level of the signal is indicated by a VU meter, while the peak level of this signal is shown by the lighting, for example, of a light emitting diodes or the like. In other words, the variation of the average level of the signal is represented by the deflection of the pointer needle of the VU meter and any signals which can not be fully followed by the VU meter are indicated by lighting the light emitting diodes. In the known indicating devices of the above described type, however, it is extremely difficult to simultaneously read both these levels due to the different indicating methods, and furthermore, since the peak level is indicated by the lighting of light emitting diodes only when the level exceeds a predetermined value, the relation between the average level and peak level is difficult to grasp unless the value at which the light emitting diode is lit is memorized in advance. For simultaneous indication of the average level and peak level, there has conventionally been proposed an arrangement which employs two pointer needless for indicating the average level by the deflection of one pointer needle and the peak level by the deflection of the other pointer needle.

The known arrangement as described above, however, has a disadvantage in that since the two pointer needles are deflected while intersecting each other in a complicated manner, it is still difficult to clearly distinguish the deflection of the two pointer needles for a correct reading, while the problems related to the delay due to the rise time and "over-shooting" of the pointer needles and arising from the mechanical structure of the meter are further complicated. Thus the indication by such a known indicating device is rather inaccurate.

In the level indicating device according to the tenth embodiment of the present invention, the disadvantages and problems inherent in the conventional arrangement as described above are eliminated in a manner such that, without employing any meter for indicating levels by the movements of pointer needles, the average level and peak level of the signal are indicated at one place for simultaneous reading, with the two readings clearly distinguishable.

Figure 29:
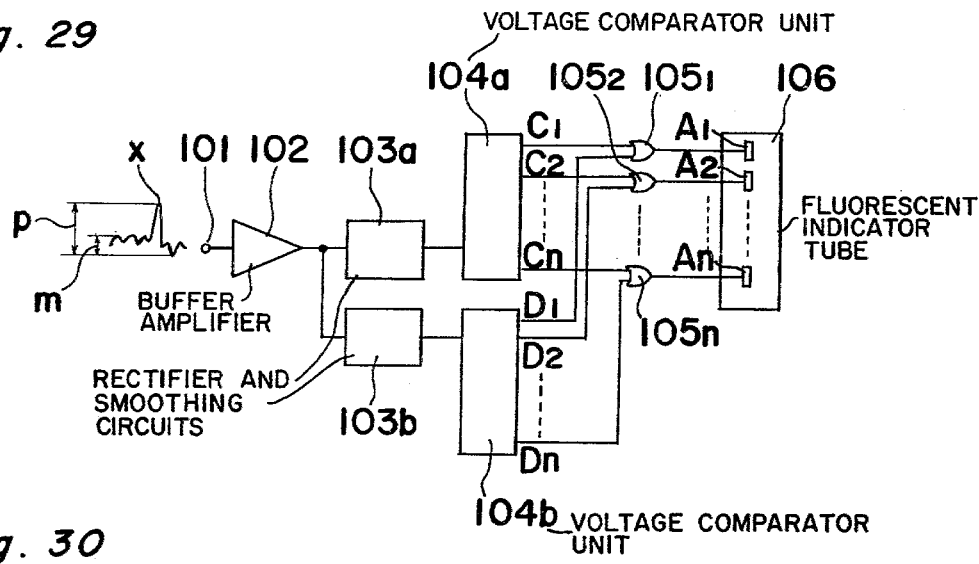
FIG. 29 is a block diagram similar to FIG. 1, which particularly shows a tenth embodiment thereof.

In FIG. 29 showing a fundamental circuit construction of the level indicating device according to the tenth embodiment of the present invention, the signal for the level indication is applied, through the input terminal 101, to a buffer amplifier 102 for proper signal amplification and impedance conversion. The output from the buffer amplifier 102 is applied to the input terminals of two rectifier and smoothing circuits 103a and 103b. One circuit 103a of the above described two circuits 103a and 103b has its charge and discharge time constants set to correspond to the average value of the input signal. The other circuit 103b has its time constants set, to correspond to the peak value. The outputs of the two rectifier circuits 103a and 103b are respectively connected to the input terminals of a pair of voltage comparator units 104a and 104b each constituted by a plurality of voltage comparators. The above voltage comparator unit 104a is arranged to have all of its output voltages higher than the output voltages of comparator unit 104b. A plurality of output terminals C1, C2 ... C(n−1) and Cn from the voltage comparator unit 104a and D., D2 ... D(n−1) and Dn from the voltage comparator unit 104b are connected for mixing to OR circuits $105_1$, $105_2$ ... $105(n−1)$ and $105n$ at each corresponding terminals, for example, in such a manner that C1 and D1 are connected to 105a, C2 and D2 are connected to 105z, and Cn and Dn are connected to 105n. The output terminals of the plurality of OR circuits $105_1$, $105_2$ ... $105(n−1)$ and $105n$ are connected to respective anode electrodes A1, A2 ... A(n−1) and An of the fluorescent indicator tube 106.

Figure 30:
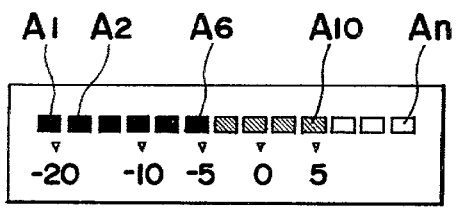
FIG. 30 is a schematic front view of the indicating surface of the fluorescent indicator tube employed in the arrangement of FIG. 29.

By the above arrangement, when a voice signal having a waveform containing a pulse component X as shown in FIG. 29 is applied to the input terminal 101, this voice signal is applied to the rectifier and smoothing circuits 103a and 103b through the buffer amplifier 102. Thus a voltage corresponding to the average level m of the above signal is produced by the circuit 103a, while a voltage corresponding to the peak level p of the above signal is developed by the other circuit 103b. On the assumption that high potential outputs are obtained, for example, at the terminals C1 to C6 of the voltage comparator unit 104a from the output of the rectifier and smoothing circuit 103a, and low potential outputs are obtained, for example, at the terminals D7 to D10 of the voltage comparator unit 104b from the output of the rectifier circuit 103b, these outputs are subsequently applied to the plurality of OR circuits for being mixed. Thus the OR circuits $105_1$ to $105_6$ develop outputs of high potential, while the OR circuits $105_7$ to $105_{10}$ produce outputs of low potential. These outputs are applied to the anode electrodes A1 to A10 of the indicator tube 106 to illuminate the latter, in which case, the intensity of illumination of the anode electrodes A1 to A6 is higher than that of the anode electrodes A7 to A10. If the anode electrodes A1, A2 ... A(n−1) and An are each formed into a rectangular shape and are laterally arranged in one row as shown in FIG. 30, the electrodes A1 to A6 on the left hand side are illuminated comparatively brightly, while the electrodes A7 to A10 on the right hand side are lit to be somewhat dimmer. The length of the former electrodes A1 to A6 thus illuminated indicates the average level m (−5 dB in FIG. 30), and the length of the latter electrodes A7 to A10 represents the peak level P (5 dB in FIG. 30), thus indicating both of the levels simultaneously and distinctively. Since the number of the electrodes illuminated is varied according to any changes in the level of the input signal, the users have a feeling that the length of a line is varied when reading the indications and can grasp the transition of levels in a very natural manner.

Based on the foregoing description of the general construction and operation of the tenth embodiment according to the present invention, detailed structure of each part of the level indicating device of the invention will be described hereinbelow.

Figure 31:
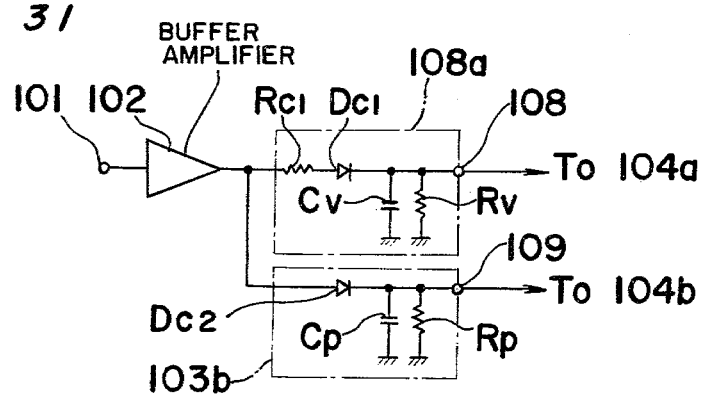
FIG. 31 is an electrical circuit diagram showing the structure of a rectifier smoothing circuit employed in the arrangement of FIG. 29.
Figure 32:
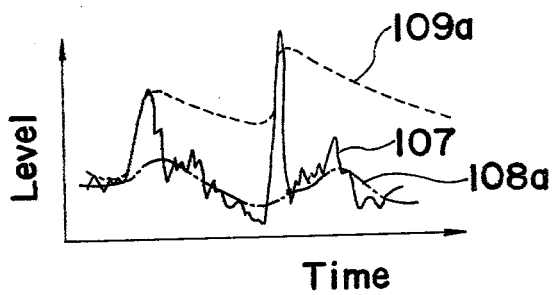
FIG. 32 is a graph comparing the waveforms of the input and output signals in the rectifier smoothing circuit of FIG. 31.

Referring particularly to FIGS. 31 and 32, further construction of the rectifier and smoothing circuits 103a and 103b and determination of the time constants thereof will be explained. In FIG. 31, the rectifier and smoothing circuit 103a includes a resistor Rc1 coupled to the output of the buffer amplifier 102 and also connected in series with a rectifier diode Dc1 which is further coupled to a parallel-connection of a smoothing capacitor Cv and a resistor Rv. The other rectifier and smoothing circuit 103b includes a rectifier diode Dc2 also coupled to the output of the buffer amplifier 102 and in turn, connected to a parallel-connection of a smoothing capacitor Cp and a resistor Rp as shown. Accordingly, the rise time of the circuit 103a is mainly determined by the time constant Rc1 and Cv, and the ball time is determined by the time constant Cv and Rv. The rise time of the circuit 103b is determined by the time constant of the output impedance Z (which is ordinarily a very small value) of the buffer amplifier the resistance component of the diode Dc2 in the forward direction and the capacitor Cp, and the fall time is determined by the time constant Cp and Rp. In the above arrangement, if the rise time of the rectifier and smoothing circuit 103b is selected to be sufficiently short or fast as compared with the rise time of the rectifier and smoothing circuit 103a and the fall time of the rectifier and smoothing circuit 103b is selected to be sufficiently long or slow as compared with the fall time of the circuit 103a, that when a signal having a waveform as shown by line 107 of FIG. 32 is applied to the terminal 101, the voltage developed at the output terminal 109 of the circuit 103b is as shown by line 109a in FIG. 32, while the voltage appearing at the output terminal 108 of the circuit 103a has a waveform as shown by line 108a in FIG. 32. In other words, the output from the circuit 103a represents the average level of the input signal, while the output from the circuit 103b indicates the peak level of the input signal.

Figure 33:
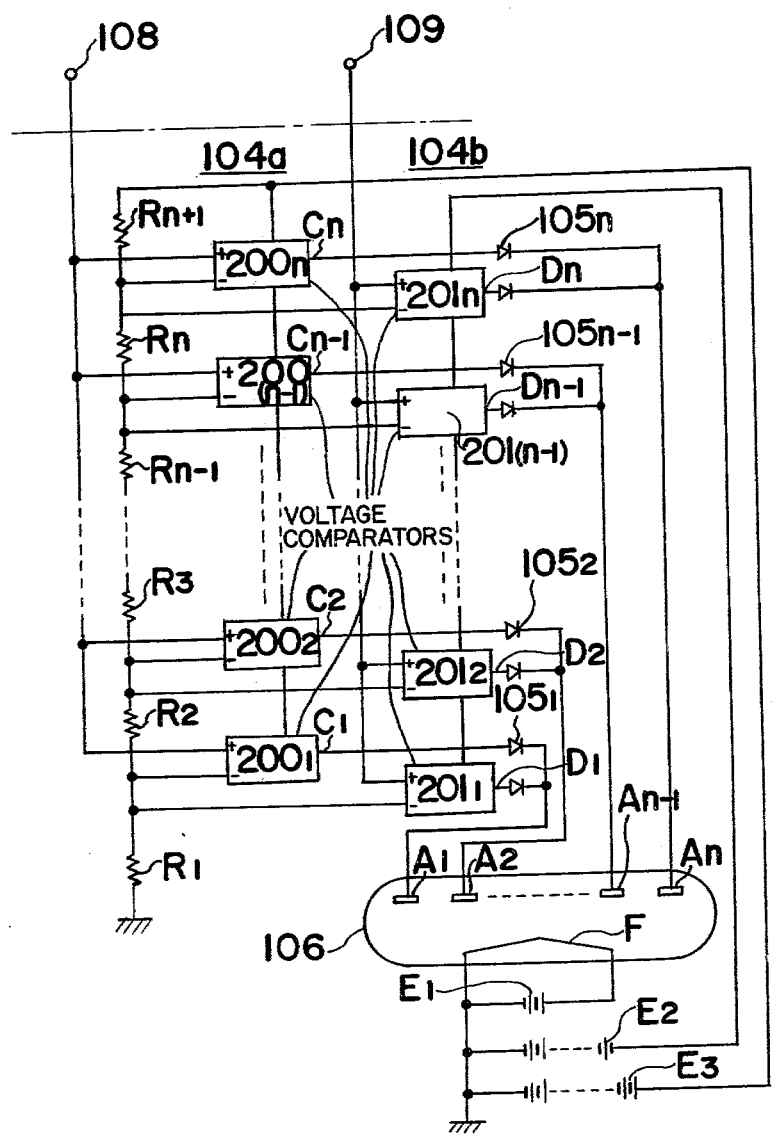
FIG. 33 is an electrical circuit diagram showing the connections between the voltage comparators and the fluorescent indicator tube employed in the arrangement of FIG. 29.

In FIG. 33 showing the circuit construction from the voltage comparator units 104a and 104b to the fluorescent indicator tube 106 more specifically, the positive input terminals of the plurality of voltage comparators $200_1, 200_2 \ldots 200(n-1)$ and $200n$ constituting the voltage comparator unit 104a are all connected to the terminal 108 (FIG. 31), while those of the plurality of voltage comparators $201_1, 201_2 \ldots 201(n-1)$ and $201n$ are all coupled to the terminal 109 (FIG. 31). To arrange the threshold values of the above voltage comparators $200_1$ to $200n$ and $201_1$ to $201n$ in the order in terms of level, the negative input terminals of these voltage comparators are connected to respective potential points obtained by dividing the voltage of the DC power source E3 by the resistance R1 ... R(n+1) in such a manner that the voltages applied thereto are sequentially higher from the negative input terminals of the voltage comparator $200_1$ and $201_1$ toward the negative input terminals of the voltage comparators $200n$ and $201n$. In the above case, the voltage comparators $200_1$ and $201_1$ are arranged to be actuated by the same threshold value to develop an output signal, while the power supply voltage for the voltage comparator unit 104a including the voltage comparator $200_1$ is supplied by the DC voltage source E3, and the power supply voltage for the voltage comparator unit 104b including the voltage comparator $201_1$ is supplied by the DC voltage source E2 having a voltage lower than the DC voltage source E3. Therefore, the output voltage E3 of the voltage comparator $201_1$ is higher than the output voltage E2 of the voltage comparator $201_1$.

Accordingly, if the level of a signal applied to the input terminals of the voltage comparator units 104a and 104b from the terminals 108 and 109 exceeds the threshold value of one of the voltage comparators, i.e., the voltage across the resistor R1, for example, for the voltage comparator $200_1$ or $201_1$, the output voltage of this voltage comparator is equal to the level of the corresponding power supply voltage source E3 or E2, while on the contrary, if this input level falls below the threshold value, the output voltage becomes ground potential level.

A plurality of output terminals C1, C2 ... C(n−1) and Cn for the voltage comparator unit 104a and D1, D2 ... D(n−1) and Dn for the voltage comparator unit 104b are commonly connected through diodes constituting OR circuits $105_1, 105_2 \ldots 105(n-1)$ and $105n$ respectively and are further connected to the anode electrodes A1, A2 ... A(n−1) and An of the fluorescent indicator tube 106. The filament F of fluorescent indicator tube 106 is heated by the DC power source E1.

Accordingly, if the output voltages of the voltage comparators $200_1$ to $200i$ and the output voltages of the voltage comparators $201_1$ to $201j$ (where $1 \leq i \leq n$) are sequentially converted from the ground potential to the potentials of the power source voltages E3 and E2 respectively, the potential of the anode electrodes A1 to Aj becomes sufficiently higher than the voltage E1 of the filament F of the indicator tube 106, and the electrons emitted from the filament F collide with the anode electrodes A1 to Aj to excite and to illuminate the fluorescent substance applied to these electrodes. In the above case, since the potential E3 of the anode electrodes A1 to Ai is higher than the potential E2 of the anode electrodes A(i+1) to Aj, the potential difference between the electrodes A1 to Ai and filament F is larger than the potential difference between the electrodes A(i+1) to Aj and the filament F. Thus the electrodes A1 to Ai are illuminated more brightly than the electrodes A(i+1) to Aj due to the characteristics of the fluorescent indicator tube whose intensity of illumination is varied approximately in proportion to the magnitude of the potential difference. Therefor the average level and peak level indications are effected as described with reference to FIG. 30.

Note here that in the foregoing tenth embodiment of the present invention, although description is mainly given with reference to the case wherein the average level and peak level of one particular signal are to be indicated, a number of circuits as shown in FIG. 29 may be prepared corresponding to the number of signals if two or more signals are to be dealt with. Furthermore, the fluorescent indicator tube 106 described as employed in the foregoing embodiment may be readily replaced, for example, by light emitting diodes formed by incorporating a plurality of luminescent chips in a casing.

As is clear from the foregoing description, according to the level indicating device of the tenth embodiment of the invention, the following effects can be obtained;

(i) Since an illuminating indicating member having a plurality of luminescent elements is employed as the level indicator, the manufacture of the indicating device is appreciably facilitated as compared with the conventional arrangements using the VU meters or the like, and the design of the indicating member can be altered comparatively freely. Furthermore, the arrangement of the invention is quite free from problems related to poor following characteristics of the pointer needle to the signal owing to the mechanical construction thereof such as delay in rising or "overshoot" of the pointer needle, thus making possible a level indication which correctly follows the signal.

(ii) Another advantage according to the arrangement of the present invention is that the average level and peak level of the signal are simultaneously indicated in the same indicating plane, with the levels being clearly distinguished from each other by the difference in illuminating intensity. By this feature of the level indicating device of the present invention as described above, the problem in the conventional arrangements that the peak indicator employed therein only serves for watching the average level, with the occurrence of distortion and the like in the peak level being undesirably overlooked due to the indicating method for the peak level being different from that for the average level is substantially eliminated.

Referring to FIGS. 34 to 38, there is shown a level indicating device according to an eleventh embodiment of the present invention which is a further improvement of the arrangement of the tenth embodiment. The indicating device of the eleventh embodiment has for its object to further facilitate the distinction between the average level and the peak level.

Figure 34:
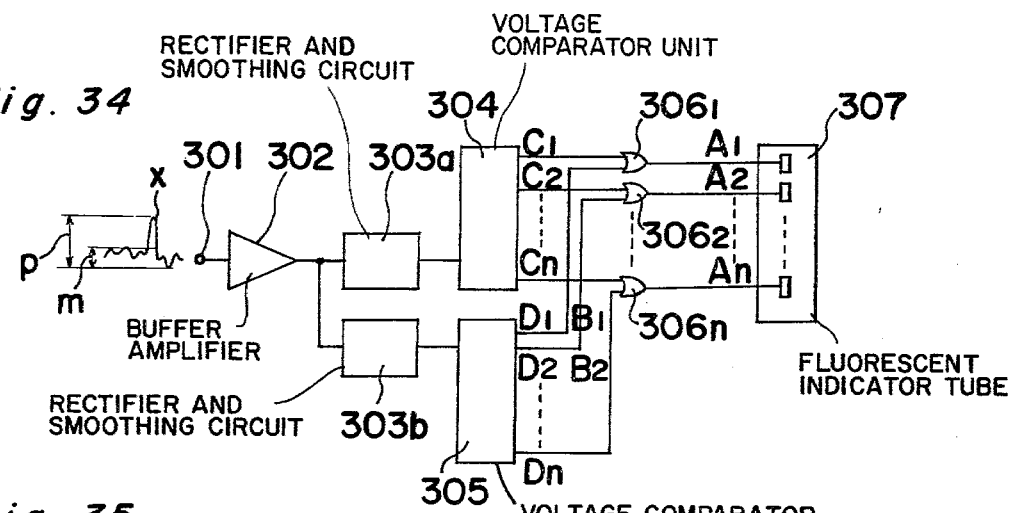
FIG. 34 is a block diagram similar to FIG. 1, which particularly shows an eleventh embodiment thereof.

In FIG. 34 showing a fundamental circuit construction of the level indicating device according to the eleventh embodiment of the present invention, the signal for the level indication is applied, through the input terminal 301, to a buffer amplifier 302 for proper signal amplification and impedance conversion. The output from the buffer amplifier 302 is applied to the input terminals of two rectifier and smoothing circuits $303a$ and $303b$. One circuit $303a$ of the above described two circuits $303a$ and $303b$ has its charge and discharge time constant set to correspond to the average value of the input signal, while the other circuit $303b$ has its time constants set correspond to the peak value. The outputs of the above two rectifier circuits $303a$ and $303b$ are respectively connected to the input terminals of a pair of voltage comparator units 304 and 305 each constituted by a plurality of voltage comparators. Note that the above voltage comparator unit 305 is constructed to develop an output voltage from the voltage comparator having a threshold value which is the closest to the output of the rectifier circuit $303b$ only. Meanwhile, a plurality of outputs C1, C2 ... C(n−1) and Cn, D1·B1, D2·B2 to D(n−1) ·B(n−1) and Dn for each of these voltage comparator units 304 and 305 are applied for mixing to OR circuits $306_1$, $306_2$ ... $306(n-1)$ and $306n$ at respective corresponding terminals, for example, in such a manner as C1 and D1, B1, C2 and D2, and Cn and Dn outputs of the plurality of OR circuits $306_1$, $306_2$ ... $306(n-1)$ and $306n$ are connected to respective anode electrodes A1, A2 ... A(n−1) and An of the fluorescent indicator tube 307.

Figure 35:
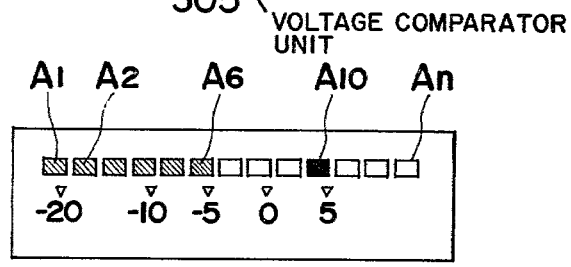
FIG. 35 is a front view of the indicating portion of the fluorescent indicator tube employed in the arrangement of FIG. 34.

By the above arrangement, when a voice signal having a waveform containing a pulse component X as shown in FIG. 34 is applied to the input terminal 301, this a voice signal is applied to the rectifier and smoothing circuits $303a$ and $303b$ through the buffer amplifier 302. Thus a voltage corresponding to the average level m of the above signal is produced by the circuit $303a$, while a voltage corresponding to the peak level P of the above signal is developed by the other circuit $303b$. On the assumption that output signals are obtained, for example, at the terminals C1 to C6 of the voltage comparator unit $303a$ by the output of the rectifier and smoothing circuit $303a$, and also output signals are obtained, for example, at the terminals D10 and B10 of the voltage comparator unit 305 by the output of the rectifier and smoothing circuit $303b$, these outputs are subsequently applied to the plurality of OR circuits for being mixed, and thus, OR circuits $306_1$ to $306_6$ and the OR circuit $306_{10}$ develop outputs. These outputs are applied to the anode electrodes A1 to A6 and A10 of the indicator tube 307 to illuminate the latter. If the anode electrodes A1, A2 ... A(n−1) and An are each formed into a rectangular shape and are laterally arranged in one row as shown in FIG. 35, the electrodes A1 to A6 on the left hand side and the electrode A10 are illuminated. The length of the former electrodes A1 to A6 thus illuminated indicates the average level m (−5 dB in FIG. 35), and the position of the illuminated electrode A10 represents the peak level P (5 dB in FIG. 35), thus both of the levels being indicated simultaneously and distinctively. Since the number of the electrodes illuminated varies according to any change in the level of the input signal, the users have a feeling that the length of a line is varied when reading the indications to grasp the transition of levels in a very natural manner as in the tenth embodiment of the invention described earlier. Moreover, the electrode illuminated in the spot spaced from the indication of the average level enables the user to readily observe the transition of the peak level through movement of the illuminated spot. Additionally, if the output voltage of the voltage comparator unit 304 is arranged to be lower than that of the voltage comparator unit 305 in the eleventh embodiment, the intensity of illumination of the electrodes A1 to A6 becomes lower than the intensity of the electrode A10 indicating the peak level as shown in FIG. 35 for a clearer distinction between the two levels.

Based on the foregoing description of the general construction and operation of the eleventh embodiment according to the present invention, detailed structure of each part of the level indicating device of the invention will be described hereinbelow.

Figure 36:
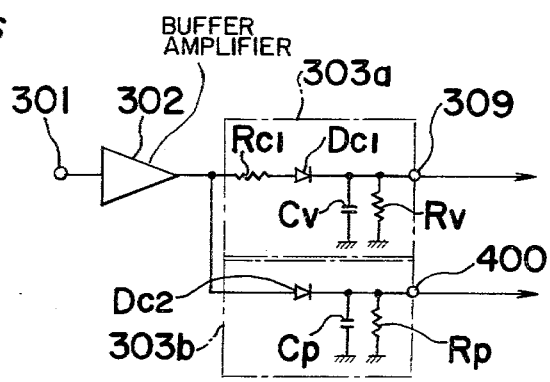
FIG. 36 is an electrical circuit diagram of the rectifier smoothing circuit employed in the arrangement of FIG. 34.
Figure 37:
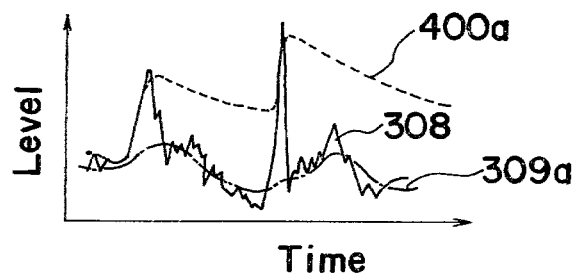
FIG. 37 is a graph comparing the waveforms of the input and output signals in the rectifier smoothing circuit of FIG. 36.

Referring particularly to FIGS. 36 and 37, further construction of the rectifier and smoothing circuits 303a and 303b and determination of their time constants will be explained. In FIG. 36, the rectifier and smoothing circuit 303a includes a resistor Rc1 coupled to the output of the buffer amplifier 302 and also connected in series with a rectifier diode Dc1 which is a further coupled to a parallel-connection of a smoothing capacitor Cv and a resistor Rv. The other rectifier and smoothing circuit 303b includes a rectifier diode DC2 also coupled to the output of the buffer amplifier 302 and in turn, connected to a parallel-connection of a smoothing capacitor Cp and a resistor Rp as shown. Accordingly, the rise time of the circuit 303a is mainly determined by the time constant Rc1 and Cv, and the fall time is determined by the time constant Cv and Rv. The rise time of the circuit 303b is determined by the time constant of the output impedance Z (which is ordinarily a very small value) of the buffer amplifier 302, the resistance component of the diode Dc2 in the forward direction and the capacitor Cp, and the fall time is determined by the time constant Cp and Rp. In the above arrangement, if the rise time of the rectifier and smoothing circuit 303b is selected to be sufficiently short or fast as compared with the rise time of the rectifier and smoothing circuit 303a and the fall time of the rectifier and smoothing circuit 303b is selected to be sufficiently long or slow as compared with that of the circuit 303a, when the signal having the waveform as shown at line 308 in FIG. 37 is applied to the terminal 301, the voltage developed at the output terminal 400 of the circuit 303b is as shown by line 400a in FIG. 37, while the voltage appearing at the output terminal 309 of the circuit 303a takes the waveform as shown by a line 309a in FIG. 37. In other words, the output from the circuit 303a represents the average level of the input signal, while the output from the circuit 303b indicates the peak level of the input signal.

Figure 38:
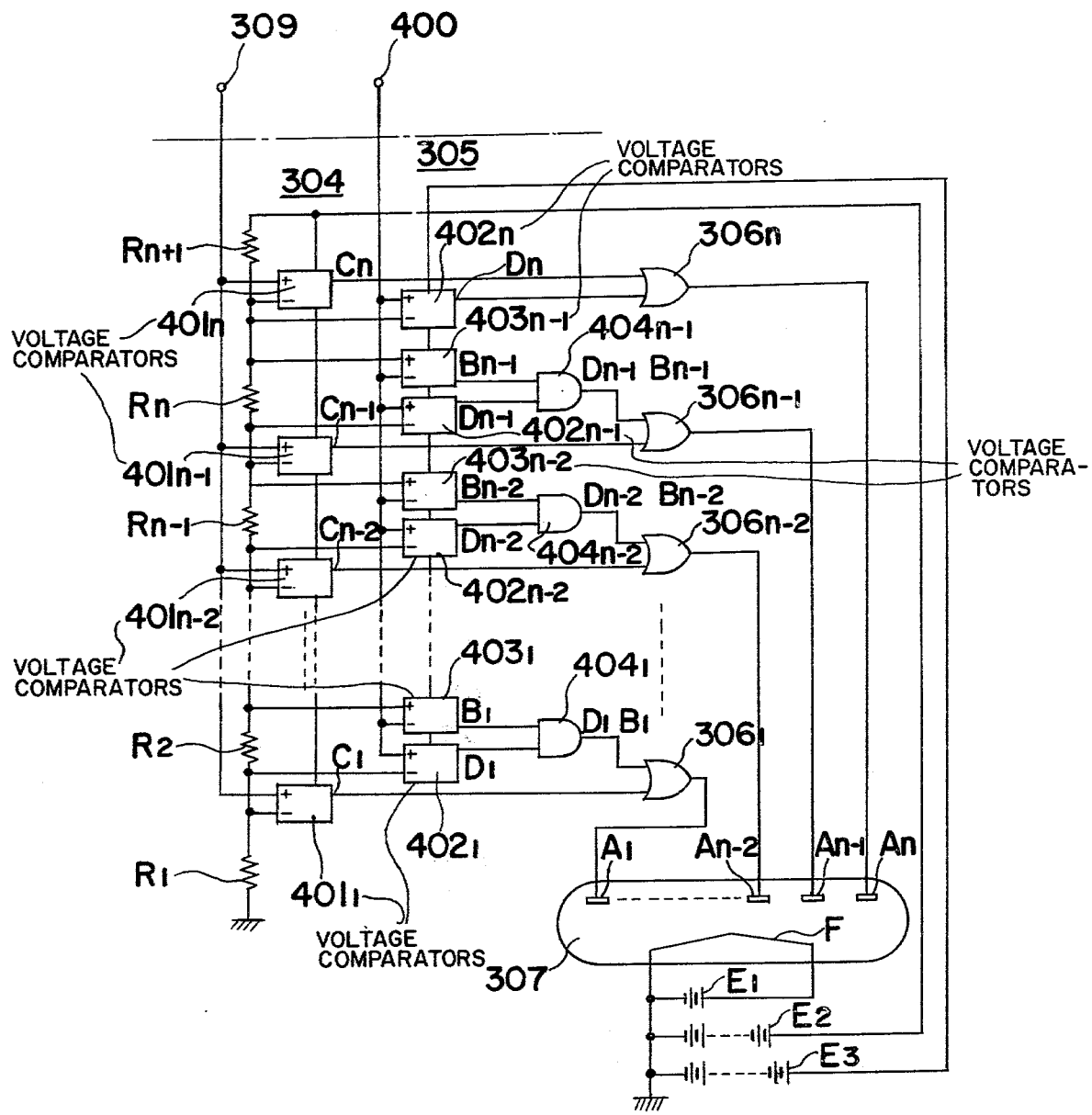
FIG. 38 is an electrical circuit diagram showing the connections of the voltage comparators, the OR circuits and the fluorescent indicator tube in the arrangement of FIG. 34.

In FIG. 38, showing the circuit construction from the voltage comparator units 304 and 305 to the fluorescent indicator tube 307 more specifically, the positive input terminals of the plurality of voltage comparators $401_1$, $401_2$ ... $401(n-1)$ and $401n$ constituting the voltage comparator unit 304 are all connected to the terminal 309 (FIG. 36), while the positive input terminals of the plurality of voltage comparators $402_1$, $402_2$ ... $402(n-1)$ and $402n$ and the negative input terminals of the voltage comparators $403_1$, $403_3$ ... $403(n-1)$ and $403n$ are all coupled to the terminal 400. To arrange the threshold values of the above voltage comparators $401_1$ to $401n$ and $402_1$ to $402n$ in an order in terms of level, the negative input terminals of these voltage comparators are connected to respective potential points obtained by dividing the voltage of the DC power source E2 by the resistance R1 ... and R(n+1) in a manner such that the voltages applied thereto are sequentially higher from the negative input terminals of the voltage comparator $401_1$ and $402_1$ toward the negative input terminals of the voltage comparators $401n$ and $402n$. In the above case, the positive input terminals of the voltage comparators $403_1$ to $403(n-1)$ are connected to respective potential points one step higher than the voltage comparators $401_1$ to $401n$ and $402_1$ to $402n$. More specifically, the negative input terminals, for example, of the voltage comparators $401_1$ and $402_1$ are connected to the junction between resistors R1 and R2, while the positive input terminal of the voltage comparator $403_1$ is coupled to the junction between resistors R2 and R3. Note that the power supply voltage for the voltage comparators $401_1$ to $401n$ is produced by the above mentioned DC power source E2, while the power supply voltage for the voltage comparators $402_1$ to $402n$ and $403_1$ to $403(n-1)$ is supplied from the DC voltage source E3 having a higher potential than the DC power source E2.

Accordingly, upon application of signals from the terminals 309 and 400 to the input terminals of the voltage comparator units 304 and 305, if the level of these signals exceeds the threshold value of one of the voltage comparators, i.e., the voltage across the resistor R1, for example, in the voltage comparators $401_1$ or $402_1$, the output signal of this voltage comparator equals the level of the corresponding power supply voltage source E3 or E2. On the contrary, if this input level falls below the threshold value, the output signal becomes the ground potential level. Simultaneously, for example, in the voltage comparator $403_1$, if the signal applied to terminal 400 exceeds the voltage across the resistance (R1+R2), the output voltage is reduced to the ground potential level, and the output voltage becomes the level of the power source voltage E3 when the input signal is below the threshold voltage thereof. Accordingly, in the voltage comparator unit 304, a plurality of the voltage comparators up to the one having a threshold value closest to the input signal level simultaneously develop output signals equivalent to the voltage E2. In the voltage comparator unit 305, except for the voltage comparator $402n$, the output of each pair of corresponding voltage comparators, for example, the voltage comparators $402_1$ and $403_1$ is passed through respective AND circuits $404_1$ to $404(n-1)$, and therefore, the output of the voltage E3 is developed only from the AND circuit at the output sides of two voltage comparators having threshold values closest to the input signal level.

A plurality of output terminals C1, C2 ... C(n-1) and Cn, D1·B1 to D(n-1)·B(n-1) and Dn for the voltage comparator units 304 and 305 are commonly connected through diodes constituting OR circuits $306_1$, $306_2$ ... $306(n-1)$ and $306n$ respectively. The OR circuits $306_1$ to $306n$ are connected to the anode electrodes A1, A2 ... A(n-1) and An of the fluorescent indicator tube 307, the filament F of which is heated by the DC power source E1.

Accordingly, if the outputs of the voltage comparators $401_1$ to $401i$ from the lower order and those of the voltage comparators $402_1$ to $402j$ (where $1 \leq i \leq j \leq n$) from the lower order are sequentially converted from the ground potential to the potentials of the power source voltages E3 and E2 respectively, a voltage E3 is produced by only the AND circuit $404j$, since in the above case, the outputs from the voltage comparators $403_1$ to $403(j-1)$ are of ground potential and only the output of the voltage comparator $403j$ equals the voltage E3. Therefore, the potential of the anode electrodes A1 to Ai and Aj becomes sufficiently higher than the voltage E1 of the filament F of the indicator tube 307, and the electrons emitted from the filament F collide with the anode electrodes A1 to Ai and Aj to excite and to illuminate the fluorescent substance applied to these electrodes. In the above case, since the potential E2 of the anode electrodes A1 to Ai is lower than the potential E3 of the anode electrode Aj, the potential difference between the electrodes A1 to Ai and filament F becomes smaller than the potential difference between the electrode Aj and the filament F. The electrodes A1 to Ai are illuminated somewhat dimmer than the electrode Aj due to the characteristic of the fluorescent indicator tube whose intensity of illumination varies approximately in proportion to the magnitude of the potential difference. Thus the average level and the peak level indications are effected as described with reference to FIG. 35.

Note here that in the foregoing eleventh embodiment of the present invention, although the description is mainly given with reference to the case in which the average level and the peak level of one particular signal are indicated, a number of circuits as shown in FIG. 34 may be prepared corresponding to the number of signals if two or more signals are to be dealt with. Furthermore, the fluorescent indicator tube 307 described as employed in the foregoing embodiment may be readily replaced, for example, by light emitting diodes formed by incorporating a plurality of luminescent chips in a casing.

As is clear from the foregoing description, according to the level indicating device of the eleventh embodiment of the invention, not only are effects similar to those in the tenth embodiment obtained, but the average level is more clearly distinguished owing to the spot indication of the peak level.

Although the present invention has been fully described by way of example with reference to the attached drawings, note that various changes and modifications are apparent to those skilled in the art. Therefore, unless these changes and modifications depart from the scope of the present invention, they should be construed as included therein.

What is claimed is:

1. A level indicating device for use in electrical or electronic apparatuses comprising:
   a first rectifying and smoothing circuit having an input signal applied thereto for rectifying and filtering said input signal for producing an output signal proportional to the average value of said input signal;
   a second rectifying and smoothing circuit having said input signal applied thereto for rectifying and filtering said input signal for producing an output signal proportional to the peak value of said input signal;
   first and second voltage comparing circuits connected to said first and second rectifying and smoothing circuits, respectively, each of said voltage comparing circuits having a plurality of voltage comparators having respective stepwise threshold values, for generating output signals indicating the level of output of said respective rectifying and smoothing circuit;
   a luminescent indicator having a plurality of luminescent elements disposed in a row, each of said luminescent elements corresponding to one of a plurality of input signal level ranges and disposed in said row according to consecutive corresponding input signal level ranges; and
   an OR circuit means connected to said first and second voltage comparing circuits and said luminescent indicator for illuminating a first set of luminescent elements corresponding to input signal level ranges not greater than the level of said output of said first rectifying and smoothing circuit at a first brightness and for illuminating a second set of luminescent elements corresponding to input signal level ranges greater than the level of said output of said first rectifying and smoothing circuit and not greater than the level of said output of said second rectifying and smoothing circuit at a second brightness differing from said first brightness.

2. A level indicating device for use in electric or electronic apparatuses comprising:
   a first rectifying and smoothing circuit having an input signal applied thereto for rectifying and filtering said input signal for producing an output signal proportional to the average value of said input signal;
   a second rectifying and smoothing circuit having said input signal applied thereto for rectifying and filtering said input signal for producing an output signal proportional to the peak value of said input signal;
   first and second voltage comparing circuits connected to said first and second rectifying and smoothing circuits, respectively, each of said voltage comparing circuits having a plurality of voltage comparators having respective stepwise threshold values, for generating output signals indicating the level of output of said respective rectifying and smoothing circuit;
   a luminescent indicator having a plurality of luminescent elements disposed in a row, each of said luminescent elements corresponding to one of a plurality of input signal level ranges and disposed in said row according to consecutive corresponding input signal level ranges; and
   an OR circuit means connected to said first and second voltage comparing circuits and said luminescent indicator for illuminating a first set of luminescent elements corresponding to input signal level ranges not greater than the level of said output of said first rectifying and smoothing circuit and for illuminating said luminescent element corresponding to the input signal level range including the level of said output of said rectifying and smoothing circuit.

* * * * *